United States Patent
Jiang et al.

(10) Patent No.: US 12,185,531 B2
(45) Date of Patent: Dec. 31, 2024

(54) 3D NOR TYPE MEMORY ARRAY WITH WIDER SOURCE/DRAIN CONDUCTIVE LINES

(71) Applicant: Taiwan Semiconductor Manufacturing Company, Ltd., Hsinchu (TW)

(72) Inventors: Yu-Wei Jiang, Hsinchu (TW); Sheng-Chih Lai, Hsinchu (TW); Feng-Cheng Yang, Zhudong Township (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 570 days.

(21) Appl. No.: 17/412,483

(22) Filed: Aug. 26, 2021

(65) Prior Publication Data

US 2023/0061925 A1 Mar. 2, 2023

(51) Int. Cl.
*H10B 41/27* (2023.01)
*H01L 23/528* (2006.01)
*H10B 41/10* (2023.01)
*H10B 41/35* (2023.01)

(52) U.S. Cl.
CPC ......... *H10B 41/27* (2023.02); *H01L 23/5283* (2013.01); *H10B 41/10* (2023.02); *H10B 41/35* (2023.02)

(58) Field of Classification Search
None
See application file for complete search history.

(56) References Cited

U.S. PATENT DOCUMENTS

| | | | |
|---|---|---|---|
| 2005/0142826 A1* | 6/2005 | Kim | H01L 21/28518 257/E21.252 |
| 2013/0134377 A1* | 5/2013 | Park | H10N 70/8828 257/E27.005 |
| 2020/0013791 A1* | 1/2020 | Or-Bach | H10B 43/20 |
| 2021/0118900 A1* | 4/2021 | Jiang | H10B 43/30 |

OTHER PUBLICATIONS

Aravindan, Avinash. "Flash 101: NAND Flash vs NOR Flash." Embedded.com Published on Jul. 23, 2018.

* cited by examiner

*Primary Examiner* — Xiaoming Liu
(74) *Attorney, Agent, or Firm* — Eschweiler & Potashnik, LLC

(57) ABSTRACT

In some embodiments, the present disclosure relates to a memory device that includes gate electrode layers arranged over a substrate. A first memory cell is arranged over the substrate and includes first and second source/drain conductive lines that extend through the gate electrode layers. A barrier structure is arranged between the first and second source/drain conductive lines. A channel layer is arranged on outermost sidewalls of the first and second source/drain conductive lines. A first dielectric layer is arranged between the barrier structure and the channel layer. A memory layer is arranged on sidewalls of the channel layer. The first dielectric layer has a first maximum width measured between outermost sidewalls of the first dielectric layer. The first source/drain conductive line has a second maximum width measured between the outermost sidewalls of the first source/drain conductive line. The second width is greater than the first width.

20 Claims, 28 Drawing Sheets

3D NOR TYPE MEMORY ARRAY WITH WIDER SOURCE/DRAIN CONDUCTIVE LINES

BACKGROUND

Two-dimensional (2D) memory arrays are prevalent in electronic devices and may include, for example, NOR flash memory arrays, NAND flash memory arrays, dynamic random-access memory (DRAM) arrays, and so on. However, 2D memory arrays are reaching scaling limits and are hence reaching limits on memory density. Three-dimensional (3D) memory arrays are a promising candidate for increasing memory density and may include, for example, 3D NAND flash memory arrays, 3D NOR flash memory arrays, and so on.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
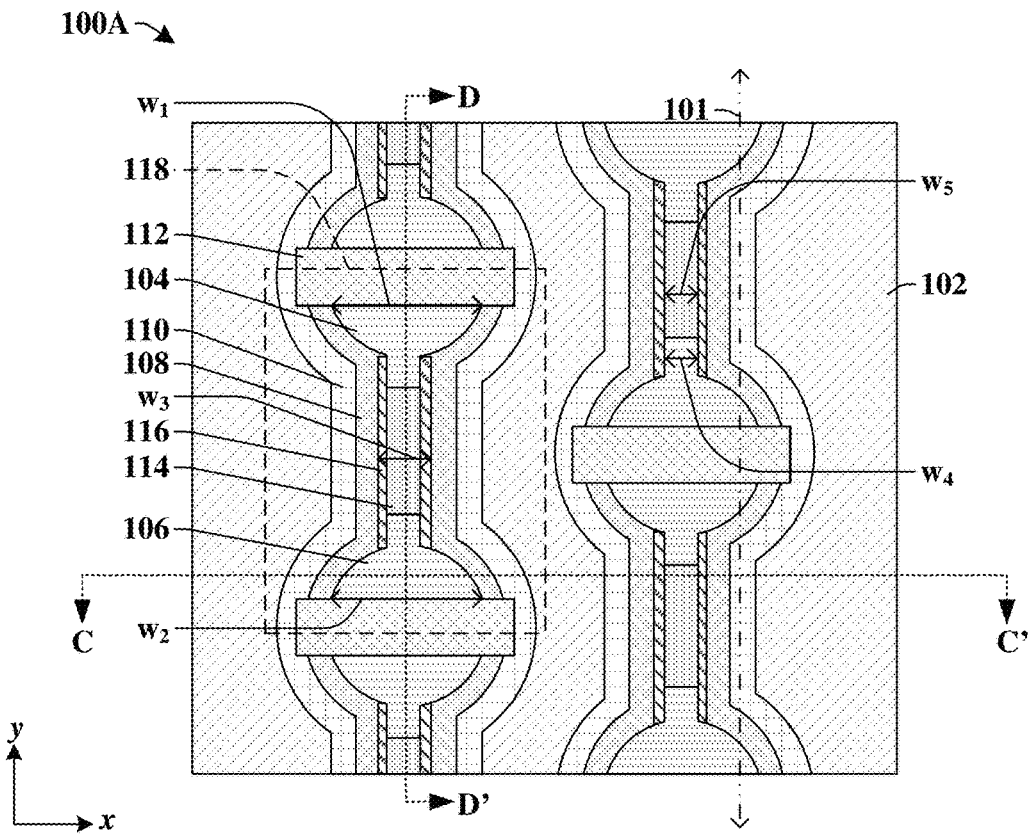
FIG. 1A illustrates a top-view of some embodiments of an integrated chip comprising a 3D NOR type memory array having source/drain conductive lines wider than a dielectric layer between the source/drain conductive lines.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A three-dimensional (3D) NOR type memory array may comprise multiple horizontally stacked gate electrode layers arranged between a source conductive line and a vertical drain conductive line that extend in the vertical direction. The 3D NOR type memory array comprises memory cells that are arranged at a high density over a substrate and are connected in parallel to achieve a sum-of-product operation. Each memory cell of the 3D NOR type memory array may be accessed by selecting a source-line coupled to a source conductive line, a bit-line coupled to a drain conductive line, and a word-line coupled to a gate electrode layer through access circuitry. A channel layer may be arranged on outermost sidewalls of the source and drain conductive lines, and a memory layer may be arranged on outermost sidewalls of the channel layer and between the gate electrode layers and the source and drain conductive lines. In some embodiments, data may be written to and read from the memory layer of each memory cell based on the current that flows through the channel layer while a memory cell is accessed.

A 3D NOR type memory array may be formed by forming a trench within a stack of gate electrode layers spaced apart from one another by interconnect dielectric layers. The memory layer, the channel layer, and dielectric layers may be deposited within the trench. Then, portions of the dielectric layers may be removed to form openings, wherein source conductive lines and drain conductive lines will later be formed in the openings. A masking structure may be used to form the openings. However, in some instances, openings of the masking structure may directly overlie portions of the channel layer and/or the memory layer, resulting in removal and/or damage to the portions of the channel layer and/or the memory layer. As a result, the 3D NOR memory array may be unreliable due to the damaged or missing portions of the channel and/or memory layers.

Various embodiments of the present disclosure relate to forming a first trench within a stack of dummy gate electrode layers spaced apart from one anther by interconnect dielectric layers. The first trench may be filled with a first sacrificial material, and portions of the first sacrificial material may be removed according to a masking structure to form first openings within the first sacrificial material. The first openings are wider than the first trench. In some embodiments, the dummy gate electrode layers are then removed and replaced by gate electrode layers, and then, the first sacrificial material is removed. In some embodiments, a memory layer, a channel layer, a first dielectric layer, and a second dielectric layer are formed within the first trench and the first openings. In some embodiments, the memory layer, the channel layer, the first dielectric layer, and the second dielectric layer completely fill the first trench, wherein in the first openings, there is space between inner sidewalls of the second dielectric layer.

In some embodiments, portions of the first and second dielectric layers within the first openings are selectively removed by an etching process which avoids damage to the channel layer and the memory layer. Further, in some embodiments, other portions of the first and second dielectric layers within the first trench are not removed by the etching process because there is no space between the layers in the first trench for the etchant to remove. In other words, in some embodiments, because the first openings have a larger width than the first trench, a masking structure is not needed to selective remove portions of the first and second dielectric layers within the first openings. In some embodiments, through various steps of deposition, removal, and patterning processes, source and drain conductive lines are then formed in the first openings to form the 3D NOR type memory array that has an increased reliability due to mitigated damage of its channel layer and memory layer during manufacturing.

FIG. 1A illustrates a top-view 100A of some embodiments of a 3D NOR type memory array comprising source/drain conductive lines that are wider than a barrier structure between the source/drain conductive lines.

The 3D NOR type memory array in the top-view 100A of FIG. 1A is on an xy-plane and includes memory cells 118 spaced apart from one another in the y-direction by cell isolation structures 112 and spaced apart from one another in the x-direction by an interconnect dielectric layer 102. Each memory cell 118 comprises a source conductive line 104, a drain conductive line 106, a channel layer 108, and a memory layer 110. In some embodiments, the channel layer 108 continuously extends from outermost sidewalls of the source conductive line 104 to outermost sidewalls of the drain conductive line 106. In some embodiments, the memory layer 110 continuously extends along outermost sidewalls of the channel layer 108. In some embodiments, the source conductive line 104 is spaced apart from the drain conductive line 106 by a barrier structure 114. In some embodiments, a first dielectric layer 116 is arranged on outermost sidewalls of the barrier structure 114 and separates the barrier structure 114 from the channel layer 108 in the x-direction. In some embodiments, portions of the source and drain conductive lines 104, 106 have outermost sidewalls in direct contact with the first dielectric layer 116.

In some embodiments, to separate each memory cell 118 in the y-direction, the cell isolation structure 112 completely separates the channel layer 108 between each memory cell 118. Further, in some embodiments, the cell isolation structure 112 completely separates the source and drain conductive lines 104, 106 between memory cells 118. In some embodiments, the cell isolation structure 112, the barrier structure 114, the first dielectric layer 116, and the interconnect dielectric layer 102 comprise dielectric materials such as, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the first dielectric layer 116 has a higher dielectric constant than the cell isolation structure 112, the barrier structure 114, and/or the interconnect dielectric layer 102. In some such embodiments, the first dielectric layer 116 may comprise, for example, aluminum oxide, hafnium oxide, or the like.

In some embodiments, the source conductive line 104 has a first width $w_1$ that is a maximum width of the source conductive line 104 and that is measured in the x-direction between outermost sidewalls of the source conductive line 104. In some embodiments, the drain conductive line 106 has a second width $w_2$ that is a maximum width of the drain conductive line 106 and that is measured in the x-direction between outermost sidewalls of the drain conductive line 106. In some embodiments, the first width $w_1$ is measured at a topmost surface of the source conductive line 104, and the second width $w_2$ is measured at a bottommost surface of the drain conductive line 106. It will be appreciated that in other embodiments, the first width $w_1$ of the source conductive line 104 may be located at a different area of the source conductive line 104, and the second width $w_2$ of the drain conductive line 106 may be located at a different area of the drain conductive line 106 than what is illustrated in FIG. 1A.

In some embodiments, a maximum distance between outermost sidewalls of the first dielectric layer 116 is equal to a third width $w_3$. The third width $w_3$ is measured in the x-direction between outermost sidewalls of the first dielectric layer 116. The outermost sidewalls of the first dielectric layer 116 directly contact innermost sidewalls of the channel layer 108. In some embodiments, the measurement of the third width $w_3$ includes a width of the barrier structure 114 and two portions of the first dielectric layer 116 arranged on either side of the barrier structure 114. In some embodiments, the third width $w_3$ of the first dielectric layer 116 is smaller than the first width $w_1$ of the source conductive line 104 and is smaller than the second width $w_2$ of the drain conductive line 106. In some embodiments, because the source conductive line 104 and the drain conductive line 106 each have a maximum width greater than the first dielectric layer 116, a line 101 that continuously extends in the y-direction may be offset from the barrier structure 114 in the x-direction and intersects with the memory layer 110, the channel layer 108, the source conductive line 104, and the drain conductive line 106 of a same memory cell 118.

In some embodiments, the source conductive line 104 and the drain conductive line 106 each have a fourth width $w_4$ that is a minimum width of the source conductive line 104 and the drain conductive line 106. In some embodiments, the barrier structure 114 has a fifth width $w_5$ that is maximum width of the barrier structure 114 measured in the x-direction. In some embodiments, the fourth width $w_4$ is about equal to the fifth width $w_5$.

In some embodiments, the third width $w_3$ is smaller than the first and second widths $w_1$, $w_2$ to reduce damage to the channel layer 108 during formation of the memory cell 118. For example, in some embodiments of forming the memory cell 118, the memory layer 110, the channel layer 108, the first dielectric layer 116, and the barrier structure 114 are formed within cavities of the interconnect dielectric layer 102. Then, portions of the first dielectric layer 116 and the barrier structure 114 are selectively removed from the channel layer 108. Because the third width $w_3$ is less than the first width $w_1$ and the second width $w_2$, the barrier structure 114 is more easily removed from the channel layer 108, thereby mitigating damage to the channel layer 108.

Figure 1B:
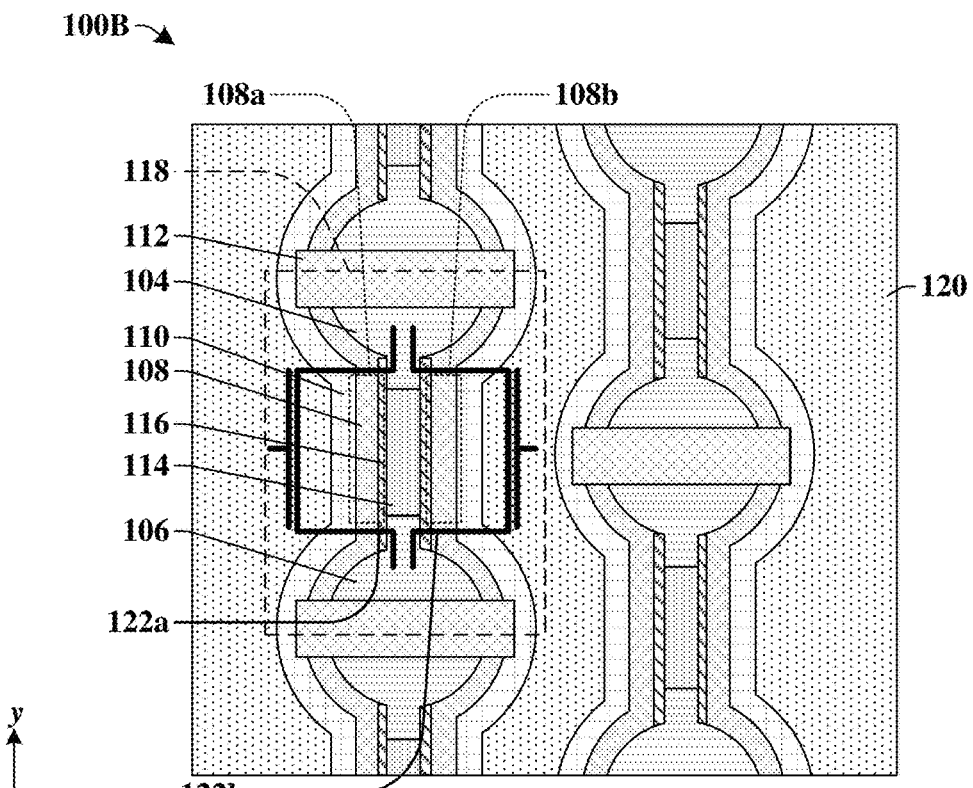
FIG. 1B illustrates a top-view corresponding to the top-view of FIG. 1A and including transistor diagrams overlaying the 3D NOR type memory array.

FIG. 1B illustrates a top-view 100B of some embodiments corresponding to the top-view 100A of FIG. 1A and including transistor diagrams to illustrate how the memory cells of the 3D NOR type memory array operate.

In some embodiments, the interconnect dielectric layer (102 of FIG. 1A) is arranged over a gate electrode layer 120. In other words, in some embodiments, in FIG. 1A, the gate electrode layer 120 is behind the interconnect dielectric layer 102. Thus, in the top-view 100B of FIG. 1B, the interconnect dielectric layer 102 is omitted, and the memory cell 118 includes a gate electrode layer 120 surrounding the memory layer 110.

In some embodiments, the gate electrode layer 120 comprises a conductive or semiconductor material such as, for example, titanium nitride, tungsten, tantalum nitride, copper, polysilicon, or the like. In some embodiments, the source and drain conductive lines 104, 106 comprise a conductive material such as, for example, titanium nitride, tungsten, tantalum nitride, copper, or some other suitable conductive material. In some embodiments, the channel layer 108 comprises a semiconductor material such as, for example, poly-silicon, amorphous-silicon, oxide-semiconductor material, indium gallium zinc oxide, or some other suitable semiconductor material. In some embodiments, the memory layer 110 comprises a material that can store data upon different biases flowing across the channel layer 108 such as, for example, a silicon dioxide-silicon nitride-silicon dioxide (ONO) structure, a ferroelectric material (e.g., hafnium oxide, hafnium zinc oxide, etc.), or some other suitable memory storage material. In some other embodiments, the memory layer 110 may comprise a semiconductor material such as, for example, poly-silicon, and act as a floating gate.

In some embodiments, each memory cell 118 may be turned "ON" by applying signals (e.g., current, voltage) to the source conductive line 104, the drain conductive line 106, and the gate electrode layer 120. Then, the channel layer 108 may be turned "ON" to cause mobile charge carriers (e.g., electrons, holes) to flow between the source conductive line 104 and the drain conductive line 106. Thus, in some embodiments, each memory cell 118 comprises a first transistor 122a arranged on a first side of the barrier structure 114 and a second transistor 122b arranged on a second side of the barrier structure 114. The first transistor 122a is turned on when mobile charge carriers flow through a first channel region 108a of the channel layer 108 on the first side of the barrier structure 114, and the second transistor 122b is turned on when mobile charge carriers flow through a second channel region 108b of the channel layer 108 on the second side of the barrier structure 114. The first and second transistors 122a, 122b may be accessed at the same time, as the first and second transistors 122a, 122b are coupled to the same source conductive line 104, drain conductive line 106, and gate electrode layer 120.

In some embodiments, based on the signals (e.g., current, voltage) applied to the source conductive line 104, the drain conductive line 106, and the gate electrode layer 120, as well as the mobile charge carriers flowing through the channel layer 108, a data state (e.g., a '1' or a '0') may be written onto the memory layer 110. Further, data states may be read from the memory layer 110 using a different amplitude of signals (e.g., current, voltage) than the signals (e.g., current, voltage) used to write a data state onto the memory layer 110.

In some embodiments, because the source and drain conductive lines 104, 106 are wider than the first dielectric layer 116, damage to the channel layer 108 during manufacturing is mitigated, thereby increasing the reliability of the first and second transistors 122a, 122b of each memory cell 118.

Figure 1C:
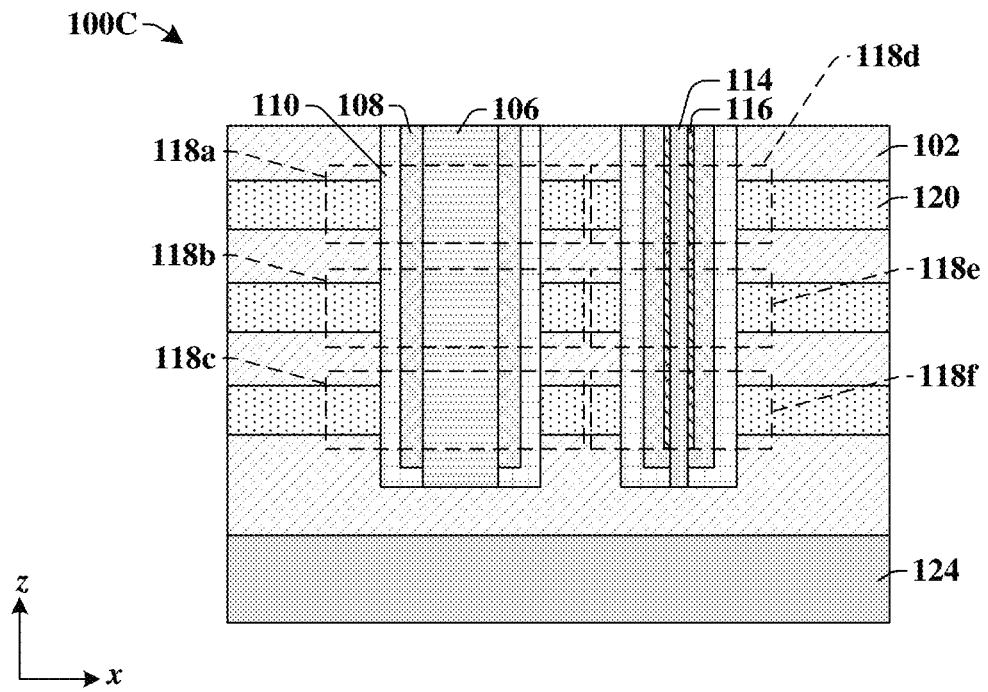
FIGS. 1C and 1D illustrate cross-sectional views of some embodiments corresponding to the top-view of FIG. 1A.

FIG. 1C illustrates a cross-sectional view 100C of some embodiments of a 3D NOR type memory array on an xz-plane. In some embodiments, the cross-sectional view 100C of FIG. 1C corresponds to cross-section line CC' of FIG. 1A.

In some embodiments, multiple gate electrode layers 120 are arranged over a substrate 124. Each gate electrode layer 120 has an upper surface and a lower surface surrounded by one of the multiple interconnect dielectric layers 102. In some embodiments, the drain conductive line 106 extends from an uppermost one of the interconnect dielectric layers 102 to a bottommost one of the interconnect dielectric layers 102 but is spaced apart from the substrate by the bottommost one of the interconnect dielectric layers 102. In some embodiments, outermost sidewalls of the drain conductive line 106 are surrounded by the channel layer 108 and the memory layer 110.

In some embodiments, the cross-sectional view 100C of FIG. 1C includes features of 6 different memory cells. For example, in some embodiments, an uppermost one of the gate electrode layers 120 and the drain conductive line 106 correspond to a first memory cell 118a; a middle one of the gate electrode layers 120 and the drain conductive line 106 correspond to a second memory cell 118b; a bottommost one of the gate electrode layers 120 and the drain conductive line 106 correspond to a third memory cell 118c; the uppermost one of the gate electrode layers 120 and the barrier structure 114 correspond to a fourth memory cell 118d; the middle one of the gate electrode layers 120 and the barrier structure 114 correspond to a fifth memory cell 118e; and the bottommost one of the gate electrode layers 120 and the barrier structure 114 correspond to a sixth memory cell 118f.

Thus, in some embodiments, the cross-sectional view 100C of FIG. 1C and the top-view 100A of FIG. 1A correspond to a three-dimensional (3D) NOR type memory array, because memory cells 118 are arranged in the x, y, and z directions, which increases the number of memory cells 118 arranged over an area of the substrate 124 (i.e., increases the device density). Further, from the cross-sectional view 100C of FIG. 1C, the drain conductive line 106 is wider than the first dielectric layer 116 to reduce damage to the channel layer 108 during manufacturing.

Figure 1D:
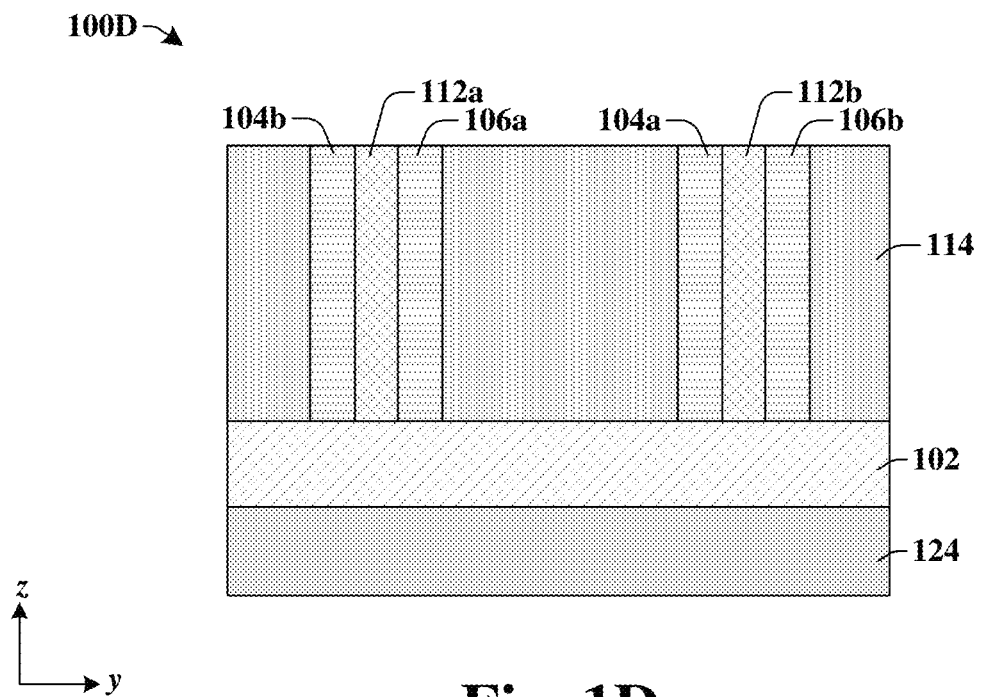

FIG. 1D illustrates a cross-sectional view 100D of some embodiments of a 3D NOR type memory array on an yz-plane. In some embodiments, the cross-sectional view 100D of FIG. 1D corresponds to cross-section line DD' of FIG. 1A.

The cross-section line DD' of FIG. 1A extends through the barrier structure 114 along the y-direction. In some embodiments, a first source conductive line 104a is spaced apart from a first drain conductive line 106a by the barrier structure 114. In some embodiments, the first source conductive line 104a and the first drain conductive line 106a are part of a same memory cell. In some embodiments, a first cell isolation structure 112a separates the first drain conductive line 106a from a second source conductive line 104b of a different memory cell, and a second cell isolation structure 112b separates the first source conductive line 104a from a second drain conductive line 106b of a different memory cell. Further, in some embodiments, the first cell isolation structure 112a completely separates the first drain conductive line 106a from the second source conductive line 104b, and the second cell isolation structure 112b completely separates the first source conductive line 104a from the second drain conductive line 106b.

It will be appreciated that in some other embodiments, the labels of the second source and drain conductive lines 104b, 106b may be switched such that the first cell isolation structure 112a separates the first drain conductive line 106a from the second drain conductive line 106b, and the second cell isolation structure 112b separates the first source conductive line 104a from the second source conductive line 104b.

Figure 2A:
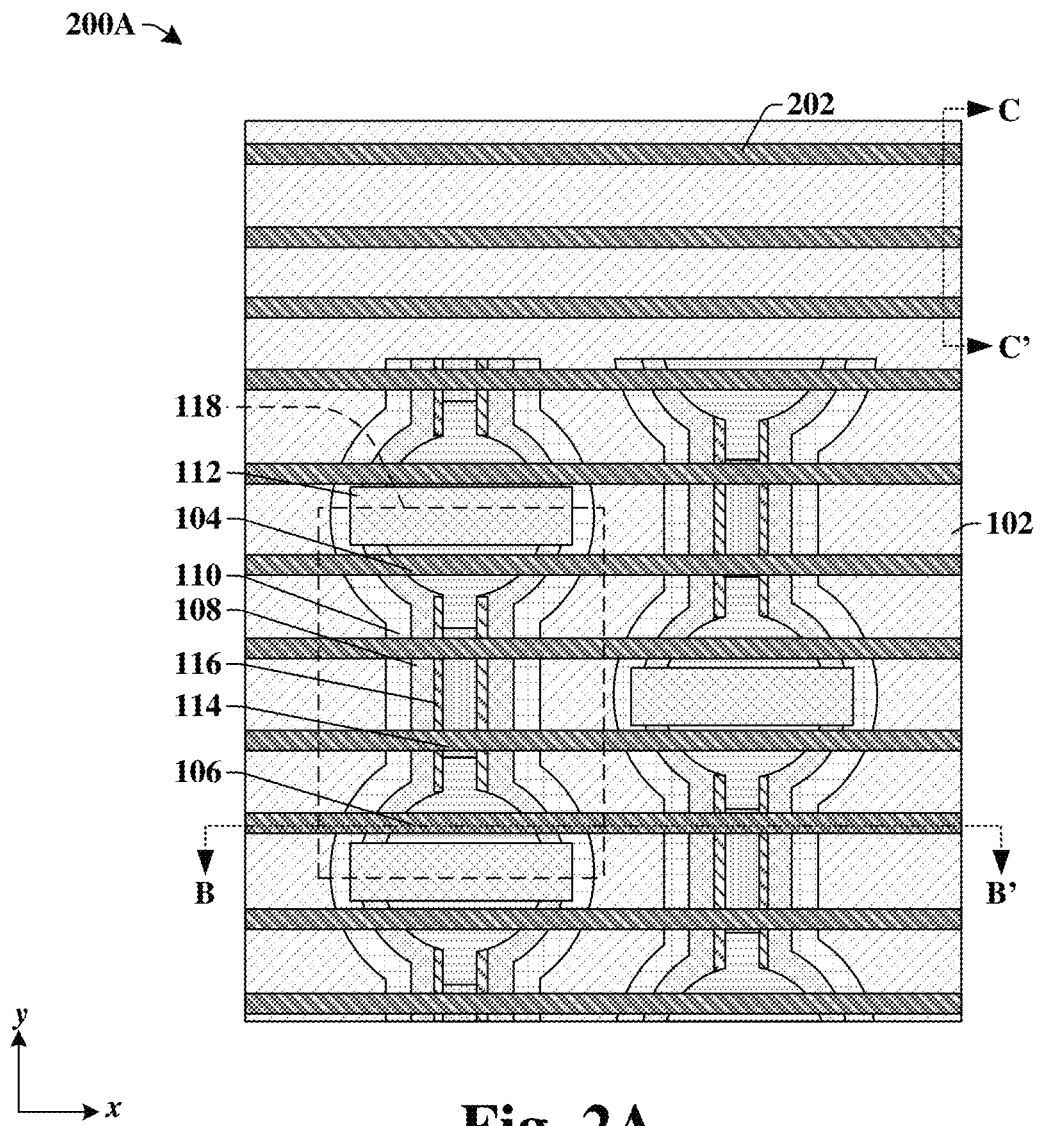
FIGS. 2A-2C illustrate various views of some embodiments of a 3D NOR type memory array having wide source/drain conductive lines and comprising an interconnect structure coupled to the source/drain conductive lines and gate electrode layers.

FIG. 2A illustrates a top-view 200A of some embodiments of interconnect conductive lines arranged over a 3D NOR type memory array.

The top-view 200A of FIG. 2A ignores an interconnect structure dielectric that would be arranged below and between the interconnect conductive lines 202. The interconnect structure dielectric layer is omitted in FIG. 2A for ease of understanding the location of the interconnect conductive lines 202 with respect to the memory cells 118 of the 3D NOR type memory array. In some embodiments, the interconnect conductive lines 202 extend in the x-direction and are spaced apart from one another in the y-direction.

Figure 2B:
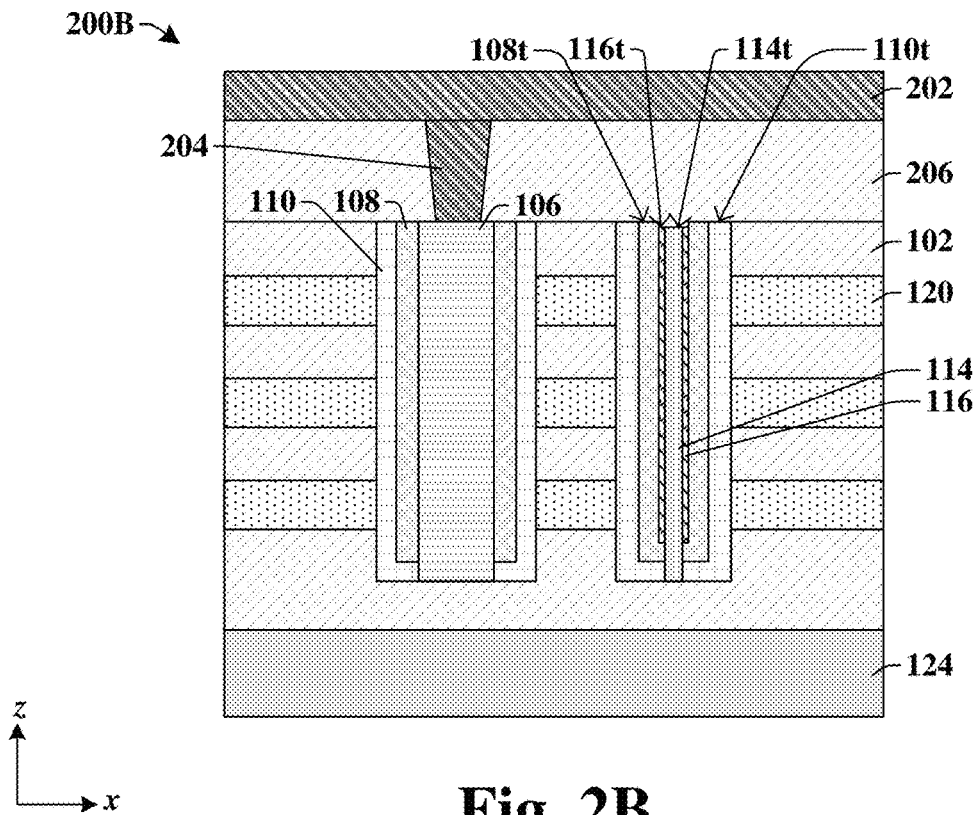

FIG. 2B illustrates a cross-sectional view 200B of some embodiments of an interconnect conductive line coupled to a drain conductive line on an xz-plane. In some embodiments, the cross-sectional view 200B of FIG. 2B corresponds to cross-section line BB' of FIG. 2A.

In some embodiments, an interconnect structure dielectric layer 206 is arranged over the interconnect dielectric layers 102, the drain conductive line 106, the channel layer 108, the memory layer 110, the barrier structure 114, and the first dielectric layer 116. In some embodiments, the interconnect conductive line 202 is coupled to the drain conductive line 106 through an interconnect contact 204 that extends in the z-direction.

Further, in some embodiments, a topmost surface 116t of the first dielectric layer 116 and a topmost surface 114t of the barrier structure 114 are arranged below a topmost surface 108t of the channel layer 108 and a topmost surface 110t of the memory layer 110 due to residual etching effects during processing.

Figure 2C:
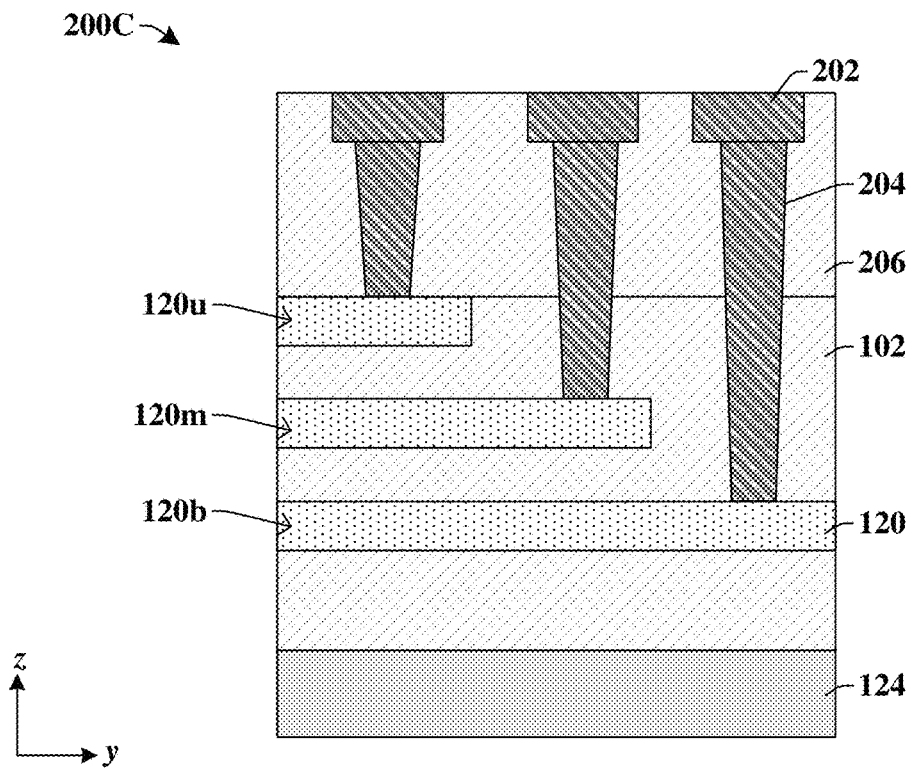

FIG. 2C illustrates a cross-sectional view 200C of some embodiments of an interconnect conductive line coupled to gate electrode layers on an yz-plane. In some embodiments, the cross-sectional view 200C of FIG. 2C corresponds to cross-section line CC' of FIG. 2A.

In some embodiments, the gate electrode layers 120 are staggered in length over the substrate 124. Staggered portions of the gate electrode layers 120 in FIG. 2C do not directly underlie the memory layers (110 of FIG. 2A) of any memory cells (118 of FIG. 2A). For example, in some embodiments, an uppermost gate electrode layer 120u is shorter than a middle gate electrode layer 120m, and the middle gate electrode layer 120m is shorter than a bottommost gate electrode layer 120b. With this staggered arrangement of the gate electrode layers 120, the interconnect contacts 204 can contact each gate electrode layer 120 and remain isolated from other gate electrode layers 120 and other interconnect contacts 204. Thus, in some embodiments, the interconnect contacts 204 that are coupled to the gate electrode layers 120 vary in height measured in the z-direction. The interconnect dielectric layers 102 and the interconnect structure dielectric layer 206 prevent unwanted cross-talk between various ones of the gate electrode layers 120, the interconnect contacts 204, and the interconnect conductive lines 202.

Figure 2D:
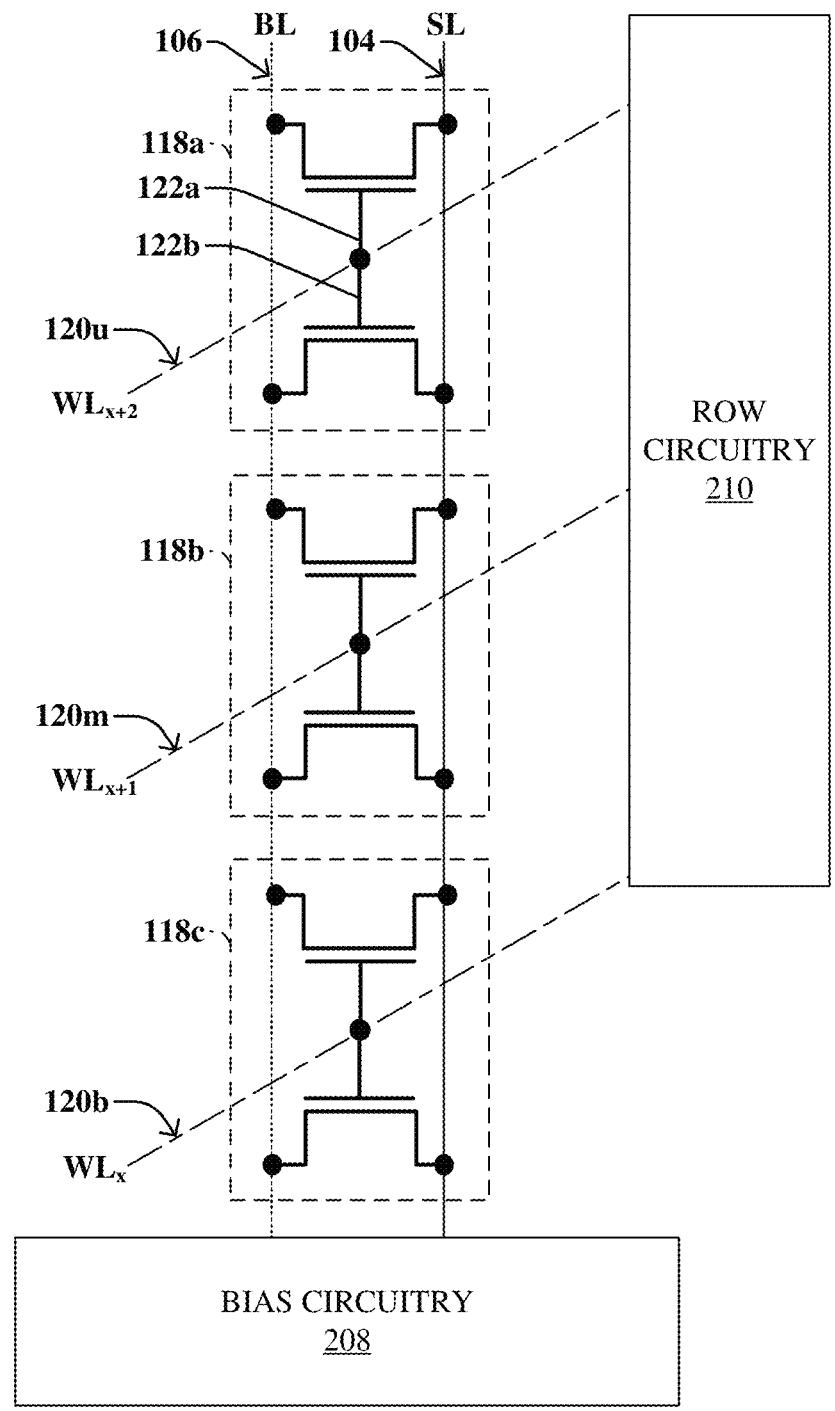
FIG. 2D illustrates a schematic of the 3D NOR type memory array coupled to bit-lines, word-lines, and source-lines and controlled by row and bias circuitry.

FIG. 2D illustrates a schematic 200D of some embodiments of memory cells of a 3D NOR type memory array coupled to a bit-line, a source-line, and word-lines and controlled by row and bias circuitry.

In some embodiments, the interconnect conductive lines (202 of FIG. 2A) correspond to bit-lines BL, source-lines SL, or word-lines WL. For example, in some embodiments, the drain conductive line 106 is coupled to an interconnect conductive line (202 of FIG. 2A) that corresponds to a bit-line BL, and the source conductive line 104 is coupled to an interconnect conductive line (202 of FIG. 2A) that corresponds to a source-line SL. The bit-line BL and the source-line SL may be coupled to bias circuitry 208 that turns the bit-line BL and the source-line SL "ON" and "OFF" by applying different signals (e.g., current, voltage) to the bit-line BL and the source-line SL.

In some embodiments, the bottommost gate electrode layer 120b is coupled to an interconnect conductive line (202 of FIG. 2A) that corresponds to a first word-line $WL_x$; the middle gate electrode layer 120m is coupled to an interconnect conductive line (202 of FIG. 2A) that corresponds to a second word-line $WL_{x+1}$; and the uppermost gate electrode layer 120u is coupled to an interconnect conductive line (202 of FIG. 2A) that corresponds to a third word-line $WL_{x+2}$. In some embodiments, the first, second, and third word-lines $WL_x$, $WL_{x+1}$, $WL_{x+2}$ are coupled to row circuitry 210 that may selectively turn one of the first, second, or third word-lines $WL_x$, $WL_{x-1}$, $WL_{x+2}$ "ON" and "OFF" by applying different signals (e.g., current, voltage) to the one of the word-lines $WL_x$, $WL_{x+1}$, $WL_{x+2}$.

Further, the schematic 200D of FIG. 2D illustrates simplified versions of the first, second, and third memory cells 118a, 118b, 118c, wherein each memory cell (118a, 118b, 118c) comprises a first transistor 122a and a second transistor 122b. Each of the first and second transistors 122a, 122b are coupled to a bit-line BL, source-line SL, and word-line WL. In the schematic 200D of FIG. 2D, a same bit-line BL and a same source-line SL are coupled to the first, second, and third memory cells 118a, 118b, 118c. However, different word-lines WL are coupled to the first, second, and third memory cells 118a, 118b, 118c. Thus, to access one of the first, second, or third memory cells 118a, 118b, 118c, the bias circuitry 208 turns "ON" the source-line SL and the bit-line BL, and a specific word-line WL (e.g., $WL_x$, $WL_{x+1}$, or $WL_{x+2}$) is turned "ON" by the row circuitry 210, while the other word-lines WL remain "OFF." Depending on the signals (e.g., current, voltage) applied to a memory cell (118a, 118b, 118c), data may be written to or read from the memory layer (110 of FIG. 2B) of the accessed memory cell (118a, 118b, 118c).

In other embodiments, wherein there are multiple bit-lines BL and multiple source-lines SL, the bias circuitry 208 also would selectively turn "ON" one of the bit-lines BL and one of the source-lines SL to access a specific memory cell 118.

FIGS. 3-6 illustrate top-views 300-600 of some alternative embodiments of a 3D NOR type memory array having wider source/drain conductive lines.

Figure 3:
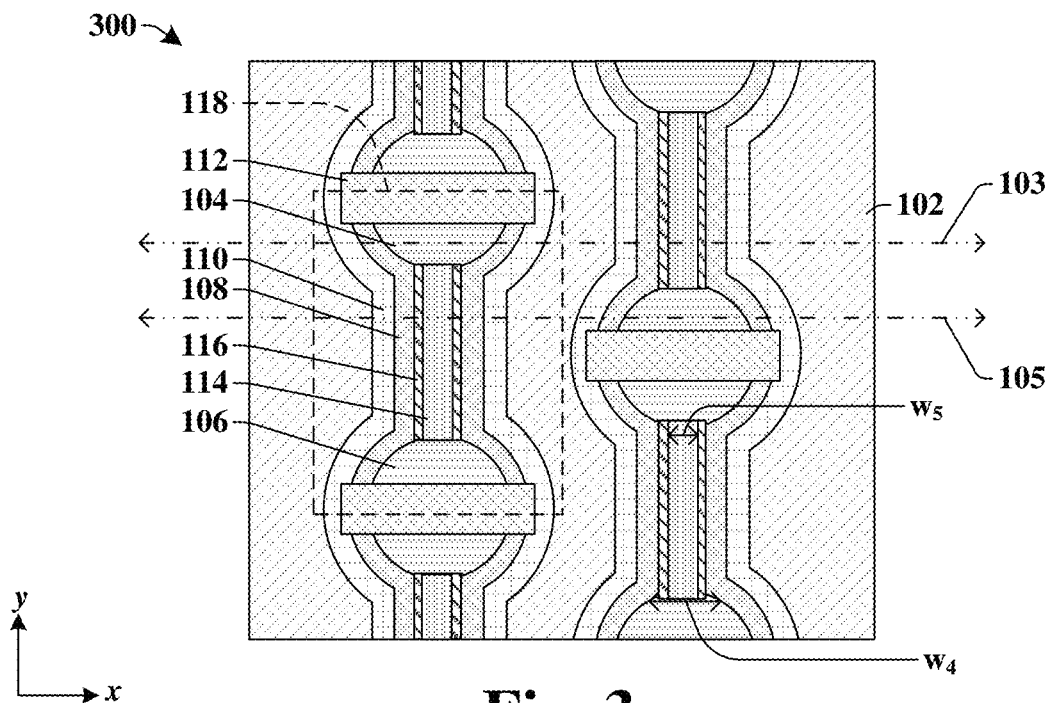
FIGS. 3-6 illustrate top-views of some other embodiments of an integrated chip comprising a 3D NOR type memory array having source/drain conductive lines wider than a dielectric layer between the source/drain conductive lines.

As shown in the top-view 300 of FIG. 3, in some embodiments, the barrier structure 114 and the first dielectric layer 116 have a larger height measured in the y-direction than illustrated in the top-view 100A of FIG. 1A. Thus, in some embodiments, the source conductive line 104 has a width measured in the x-direction that continuously decreases in the y-direction from a topmost surface of the source conductive line 104 towards a bottommost surface of the source conductive line 104. Similarly, in some embodiments, the drain conductive line 106 has a width measured in the x-direction that continuously increases in the y-direction from a topmost surface of the drain conductive line 106 towards a bottommost surface of the drain conductive line 106. In some such embodiments, the fourth width $w_4$ of the source and drain conductive lines 104, 106, which is a minimum width of the source and drain conductive lines 104, 106 is greater than the fifth width $w_5$ of the barrier structure 114, which is a maximum width of the barrier structure 114.

In some such embodiments, the source and drain conductive lines 104, 106 may have substantially curved outermost sidewalls. In such embodiments, the source and drain conductive lines 104, 106 may have substantially semi-circular profiles from the top-view 300. In some other embodiments, the source and drain conductive lines 104, 106 may have substantially straight outermost sidewalls. In such other embodiments, the source and drain conductive lines 104, 106 may have substantially triangular profiles from the top-view 300.

In some embodiments, to conserve space over the substrate (124 of FIG. 1C), the memory cells 118 are not symmetrically arranged in the x-direction. In other words, in some embodiments, a barrier structure 114 of a memory cell 118 may be directly spaced apart from a cell isolation structure 112 of another memory cell 118 in the x-direction instead of directly spaced apart from a barrier structure 114 of another memory cell 118. In some such embodiments, wider areas (e.g., the source and drain conductive lines 104, 106) of one memory cell 118 are directly beside narrower areas (e.g., the barrier structure 114) of another memory cell in the x-direction. In such embodiments, memory layers 110 of different memory cells 118 in the x-direction are adequately spaced apart by the interconnect dielectric layer 102 to prevent cross-talk between the memory layers 110 of different memory cells 118.

Thus, in some embodiments, a first line 103 continuously extends in the x-direction intersects a source or drain conductive line 104, 106 of a first memory cell and a barrier structure 114 of an adjacent memory cell. Similarly, in some embodiments, a second line 105 that is spaced apart from and parallel to the first line 103 intersects a barrier structure 114 of the first memory cell and a source or drain conductive line 104, 106 of the adjacent memory cell.

Figure 4:
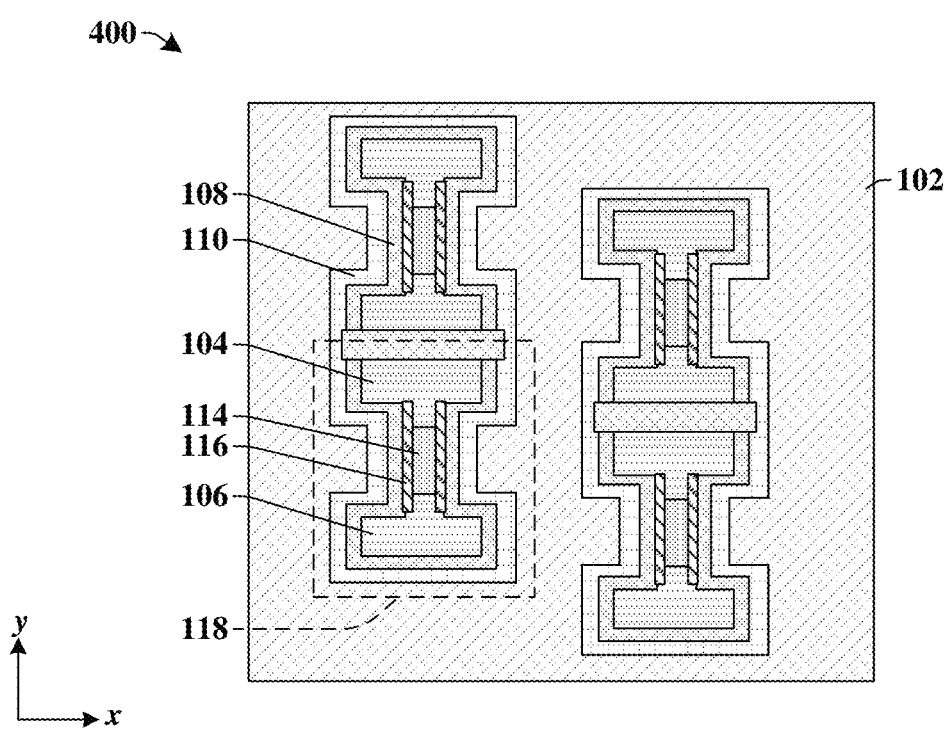

As shown in the top-view 400 of FIG. 4, in some other embodiments, the source conductive lines 104 and the drain conductive lines 106 have rectangular profiles from the top-view 400 perspective.

Figure 5:
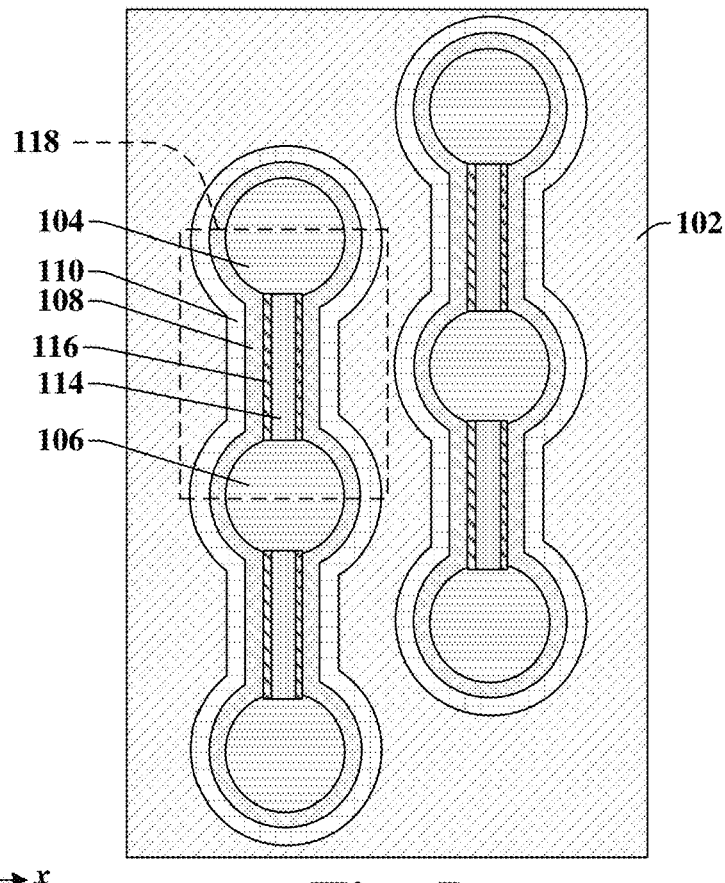

As shown in the top-view 500 of FIG. 5, in some other embodiments, the cell isolation structures (112 of FIG. 3) are omitted, such that memory cells 118 spaced apart from one another in the y-direction share source conductive lines 104 and drain conductive lines 106. In some such embodiments, the source conductive lines 104 and the drain conductive lines 106 have substantially circular profiles from the top-view 500. Further, in some such embodiments, a same channel layer 108 continuously extends along the memory cells sharing a same source or drain conductive line 104, 106.

Figure 6:
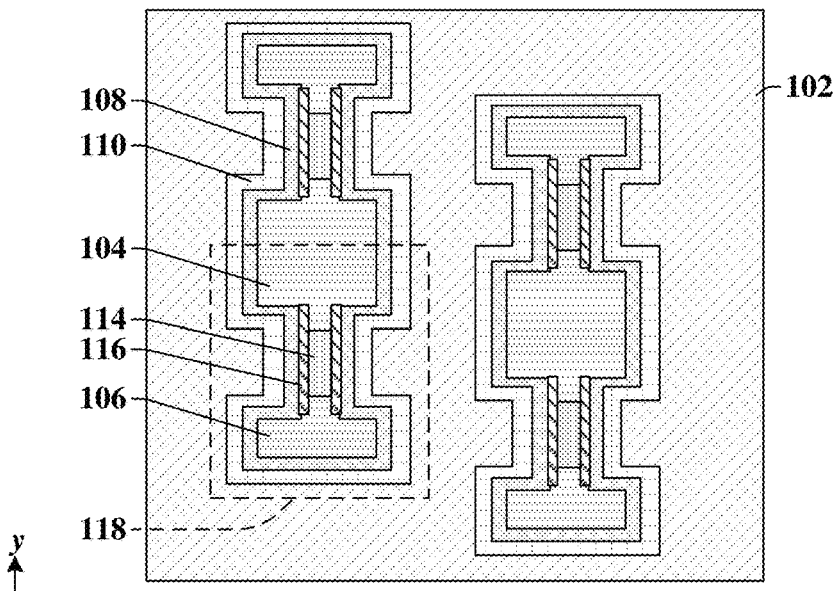

As shown in the top-view 600 of FIG. 6, in some other embodiments, the cell isolation structures (112 of FIG. 4) are omitted, such that memory cells 118 spaced apart from one another in the y-direction share source conductive lines 104 and drain conductive lines 106. In some such embodiments, the source conductive lines 104 and the drain conductive lines 106 have substantially rectangular profiles from the top-view 600. By omitting the cell isolation structures (112 of FIGS. 3 and 4), steps may be saved during processing and the size of the memory cells 118 may be reduced in the y-direction to increase device density.

FIGS. 7A-24C illustrate various views 700A-2400C of some embodiments of a method of forming a 3D NOR type memory array by forming wider openings in a trench prior to depositing channel and memory layers to mitigate damage to the channel and memory layers during future processing steps. Although FIGS. 7A-24C are described in relation to a method, it will be appreciated that the structures disclosed in FIGS. 7A-24C are not limited to such a method, but instead may stand alone as structures independent of the method.

In FIGS. 7A-24C, it will be appreciated that the "A" figures (e.g., 7A, 8A, 9A, 10A, etc.) are top-views on the xy-plane, whereas the "B" figures (e.g., 7B, 8B, 9B, 10B, etc.) are cross-sectional views on the xz-plane that correspond to cross-section line BB' of the previous "A" figure. For example, cross-sectional view 700B of FIG. 7B corresponds to cross-section line BB' of top-view 700A of FIG. 7A.

Figure 7A:
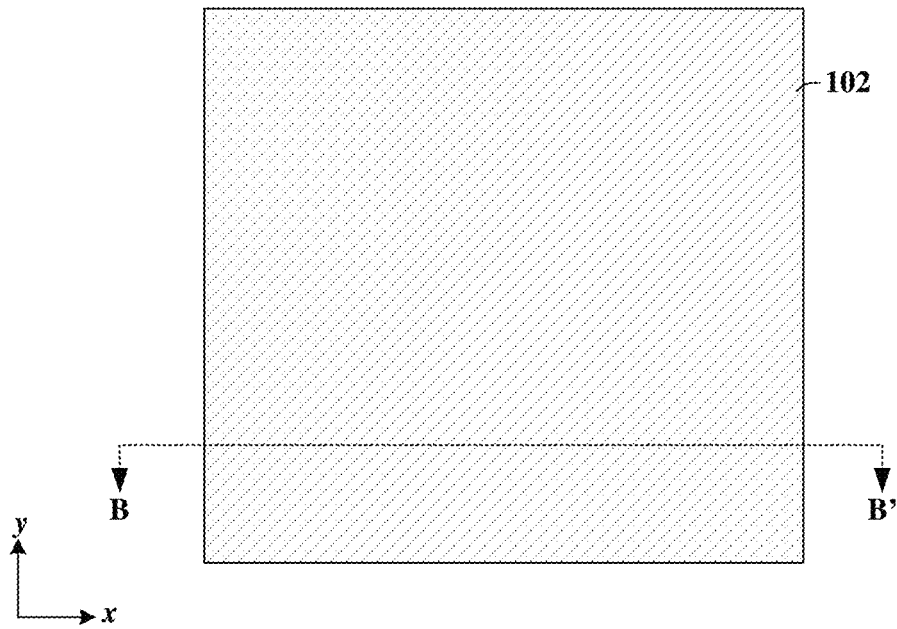
FIGS. 7A-24C illustrate various views of some embodiments of a method of forming a 3D NOR type memory array to mitigate damage to the channel layer and increase reliability of the 3D NOR type memory array.
Figure 7B:
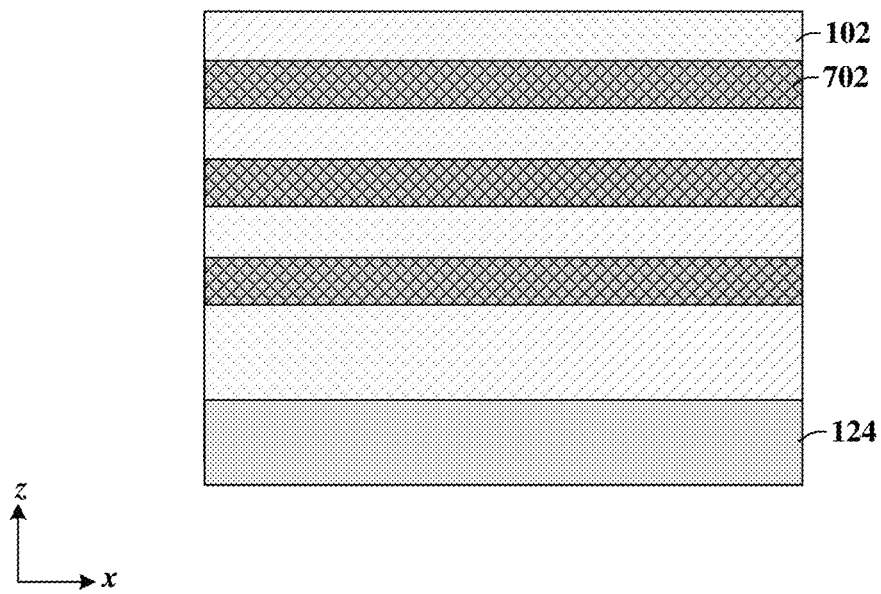

As shown in the top-view 700A of FIG. 7A and in the cross-sectional view 700B of FIG. 7B, in some embodiments, dummy gate electrode layers 702 arranged between interconnect dielectric layers 102 are formed over a substrate 124. An interconnect dielectric layer 102 is arranged above and below each dummy gate electrode layer 702. In some embodiments, the substrate 124 comprises any type of semiconductor body (e.g., silicon/CMOS bulk, SiGe, SOI, etc.) such as a semiconductor wafer or one or more on a wafer as well as any other type of semiconductor and/or epitaxial layers formed thereon or otherwise associated therewith.

In some embodiments, the interconnect dielectric layers 102 comprise, for example, a dielectric material such as a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the interconnect dielectric layers 102 are formed by way of a deposition process (e.g., chemical vapor deposition (CVD), physical vapor deposition (PVD), atomic layer deposition (ALD), etc.).

In some embodiments, the dummy gate electrode layers 702 comprise, for example, silicon nitride, silicon carbide, or the like. In some embodiments, the dummy gate electrode layers 702 comprise a different material than the interconnect dielectric layers 102 such that the dummy gate electrode layers 702 may be later removed and replaced by a conductive material to form gate electrode layers. In some embodiments, the dummy gate electrode layers 702 may be formed by way of a deposition process (e.g., CVD, PVD, ALD, etc.).

Figure 8A:
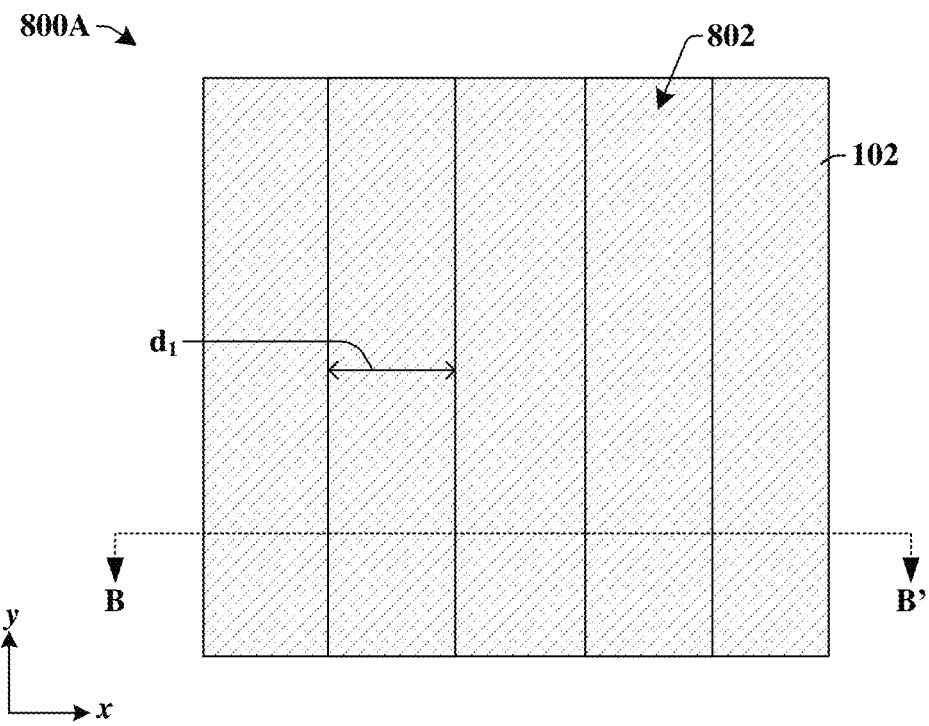
Figure 8B:
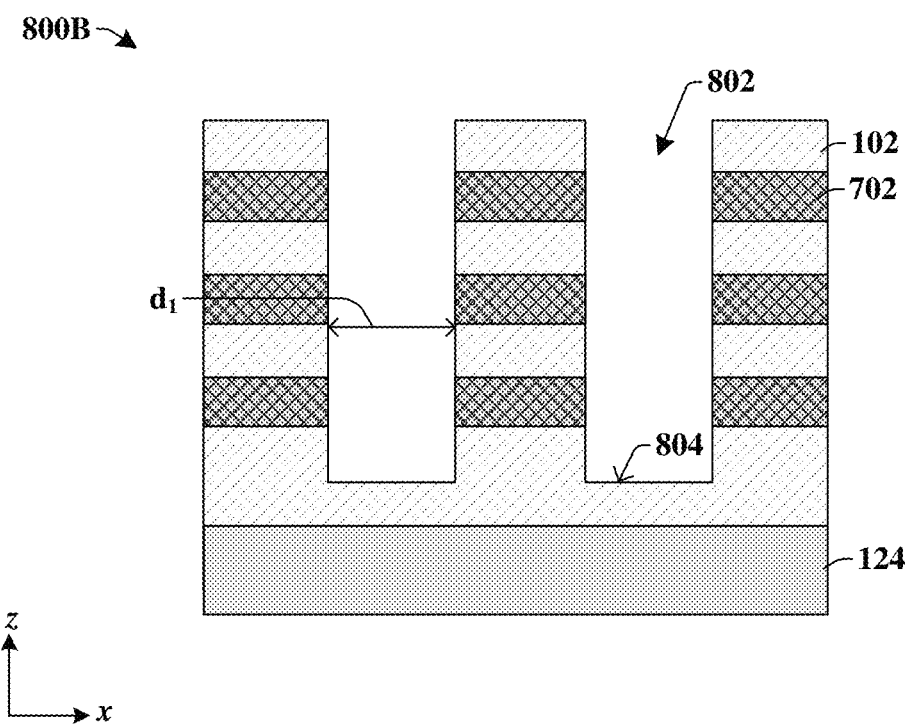

As shown in top-view 800A of FIG. 8A and in cross-sectional view 800B of FIG. 8B, in some embodiments, a removal process is performed to form trenches 802 within the interconnect dielectric layers 102 and the dummy gate electrode layers 702. In some embodiments, trenches 802 are formed by first forming a masking structure over the interconnect dielectric layers 102 through various steps of deposition (e.g., PVD, CVD, ALD, spin-on, etc.), photolithography, and removal (e.g., etching, chemical mechanical planarization (CMP)) processes. After the formation of the masking structure over the interconnect dielectric layers 102, the removal process of FIGS. 8A and 8B is performed to remove portions of the interconnect dielectric layers 102 and the dummy gate electrode layers 702 according to openings in the masking structure. In some embodiments, the trenches 802 have a width measured in the x-direction that is equal to a first distance $d_1$. In some embodiments, the first distance $d_1$ is in a range of between, for example, approximately 10 nanometers and approximately 450 nanometers. In some embodiments, more or less than two trenches 802 are formed over the substrate 124.

In some embodiments, the removal process of FIGS. 8A and 8B comprises a wet or dry etching process. In some embodiments, the removal process of FIGS. 8A and 8B is stopped when a first middle surface 804 of a bottommost one of the interconnect dielectric layers 102 is exposed. In other words, in some embodiments, the first middle surface 804 of the bottommost one of the interconnect dielectric layers 102 defines a bottommost surface of the trenches 802. In some embodiments, the removal process of FIGS. 8A and 8B is controlled by etching time. In some embodiments, the bottommost one of the interconnect dielectric layers 102 is thicker than other ones of the interconnect dielectric layers 102 to ensure that the substrate 124 is not exposed during the removal process of FIGS. 8A and 8B.

Figure 9A:
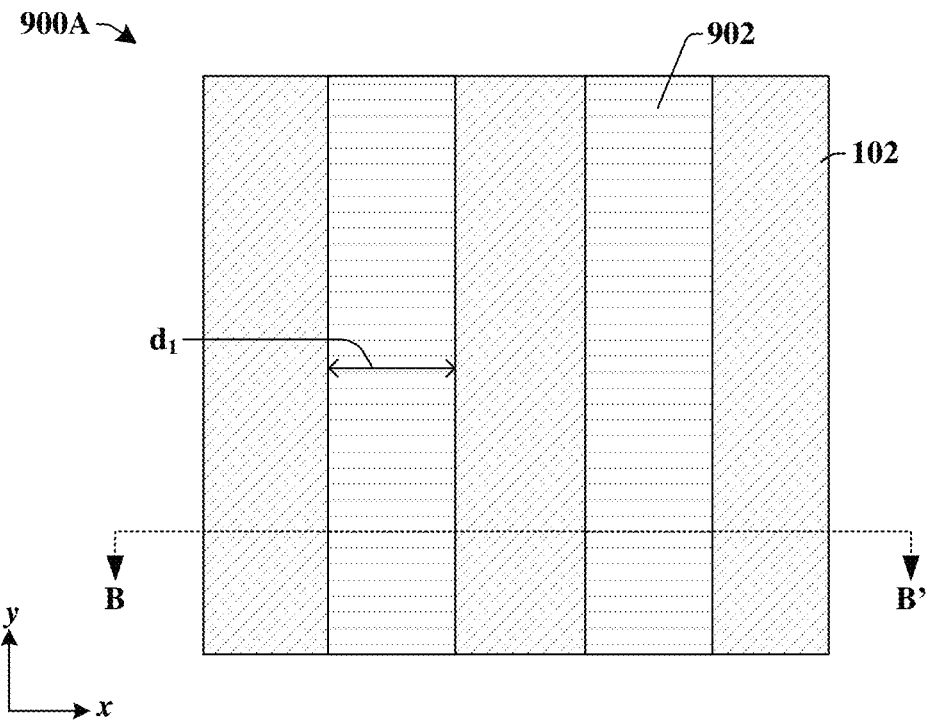
Figure 9B:
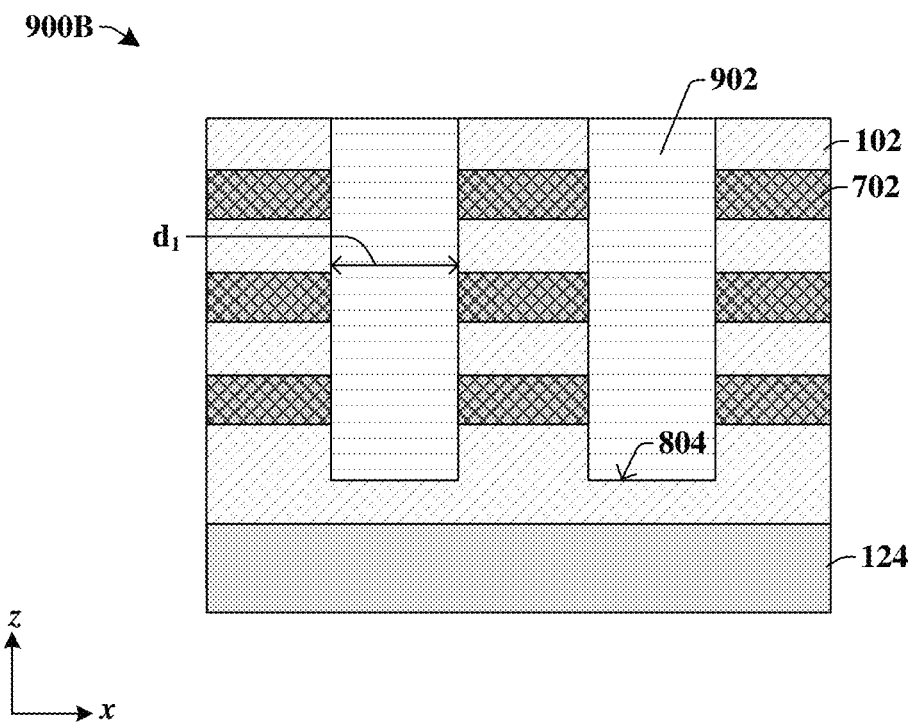

As shown in top-view 900A of FIG. 9A and in cross-sectional view 900B of FIG. 9B, the trenches (802 of FIGS. 8A and 8B) are filled with a first sacrificial material 902. In some embodiments, the first sacrificial material 902 is formed by way of a deposition process (e.g., PVD, CVD, ALD, etc.). In some embodiments, a removal process, such as chemical mechanical planarization (CMP) is performed after the deposition process to remove portions of the first sacrificial material 902 arranged over an uppermost one of the interconnect dielectric layers 102. In some embodiments, the first sacrificial material 902 comprises a material that is different than the dummy gate electrode layers 702 and the interconnect dielectric layers 102 such that the first sacrificial material 902 may later be selectively removed without removing portions of the dummy gate electrode layers 702 and the interconnect dielectric layers 102. For example, in some embodiments, the first sacrificial material 902 may comprise silicon carbide, silicon, silicon oxygen carbide, or some other suitable material that has a high etching selectivity to the dummy gate electrode layers 702 and the interconnect dielectric layers 102.

Figure 10A:
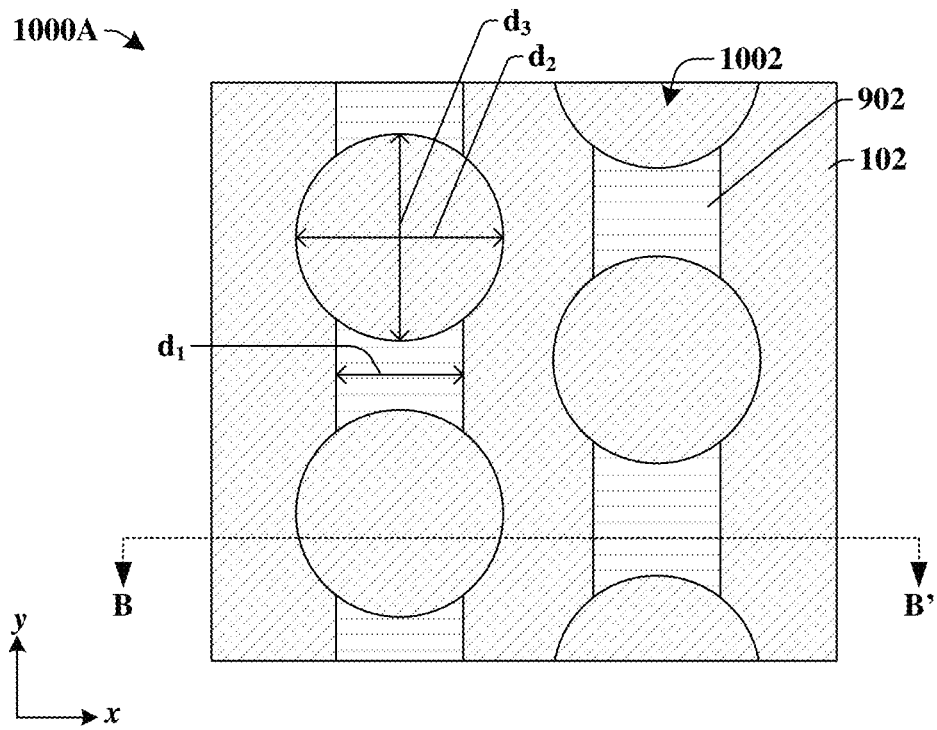
Figure 10B:
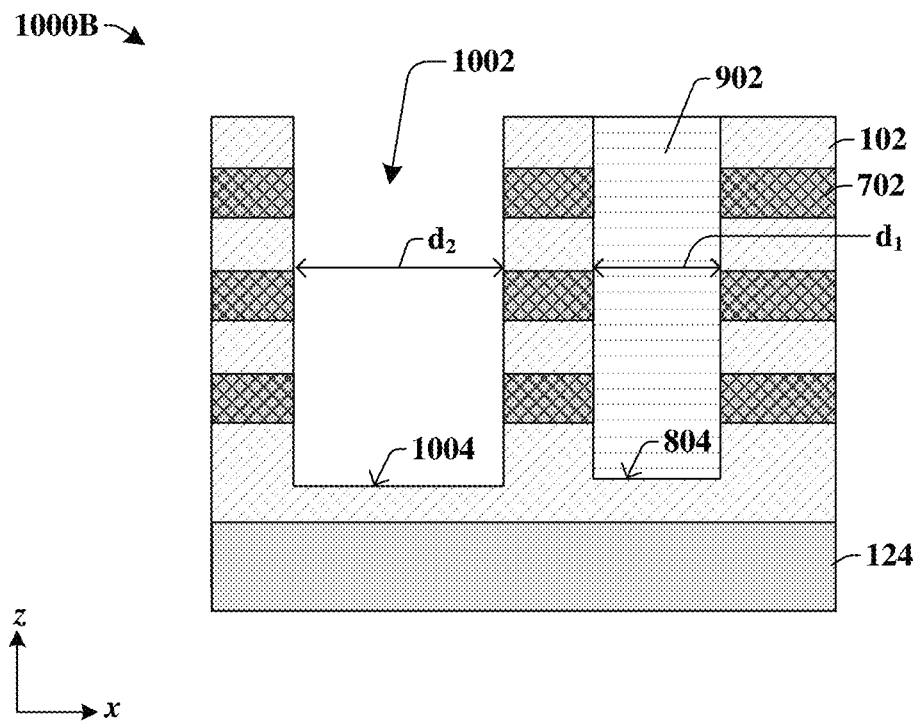

As shown in top-view 1000A of FIG. 10A and cross-sectional view 1000B of FIG. 10B, first openings 1002 may be formed over the trenches (802 of FIGS. 8A and 8B) by removing portions of the first sacrificial material 902, the interconnect dielectric layers 102 and the dummy gate electrode layers 702. In some embodiments, the first openings 1002 are formed using another masking structure comprising openings arranged directly over the trenches (802 of FIGS. 8A and 8B) followed by a removal process (e.g., wet or dry etching). In some embodiments, the first openings 1002 are wider than the trenches (802 of FIGS. 8A and 8B). For example, in some embodiments, the first openings 1002 have a width measured in the x-direction that is equal to a second distance $d_2$, wherein the second distance $d_2$ is greater than the first distance $d_1$. In some embodiments, the first openings 1002 have a height measured in the y-direction that is equal to a third distance $d_3$. In some embodiments, the first openings 1002 have a substantially circular profile from the top-view 1000A of FIG. 10A, and thus, the second distance $d_2$ is about equal to the third distance $d_3$. In some other embodiments, the first openings 1002 may have a substantially rectangular, diamond-like, oval-like, or some other suitable shaped profile from the top-view 1000A of FIG. 10A. In some embodiments, the second and third distances $d_2$, $d_3$ are each in a range of between, for example, approximately 50 nanometers and approximately 500 nanometers.

In some embodiments, the first openings 1002 have bottommost surfaces defined by a second middle surface 1004 of the bottommost one of the interconnect dielectric layers 102. In some embodiments, the second middle surface 1004 is above, below, or at about a same level as the first middles surface 804. In some embodiments, as illustrated in the top-view 1000A of FIG. 10A, the first openings 1002 are spaced apart from one another in the y-direction by the first sacrificial material 902. Further, in some embodiments, the cross-section line BB' of FIG. 10A intersects with the first opening 1002 and the first sacrificial material 902. In other words, in some embodiments, the first openings 1002 are not arranged directly beside one another in the x-direction to prevent the first openings 1002 from touching one another in the x-direction.

Figure 11A:
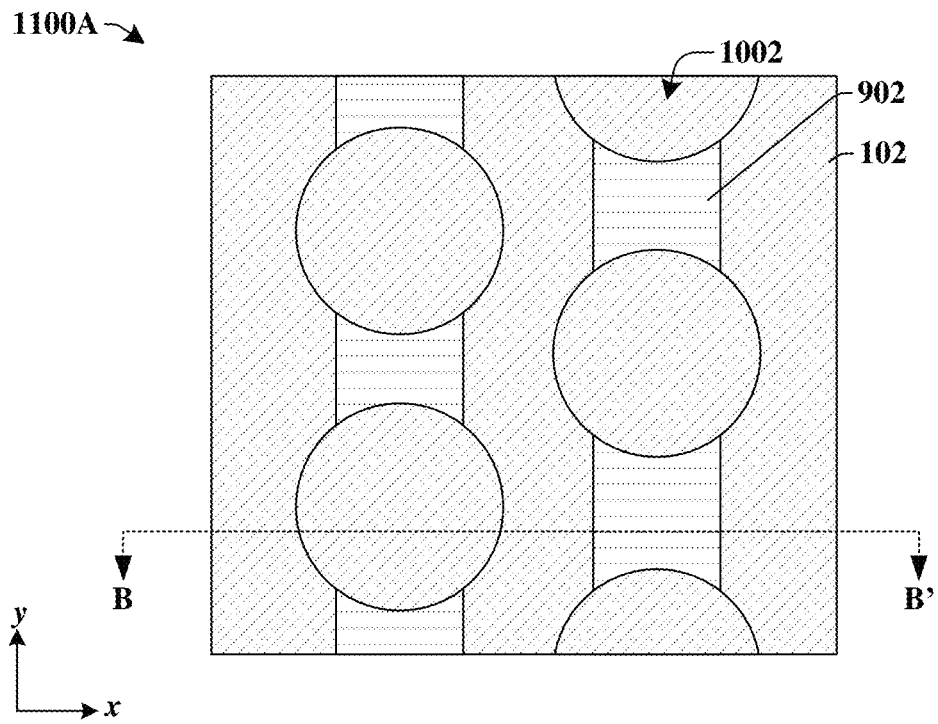
Figure 11B:
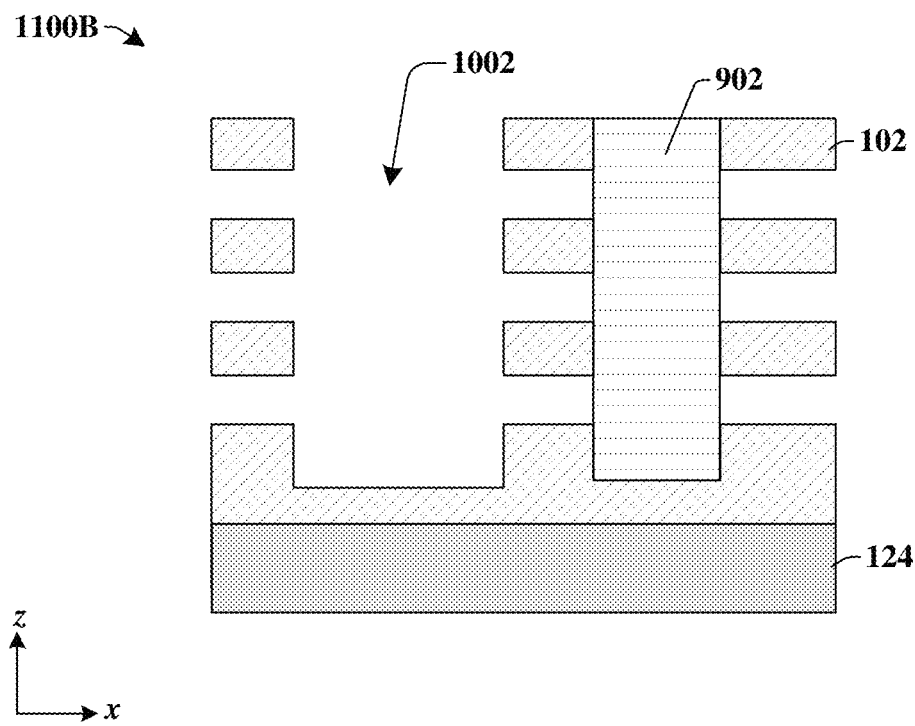

As shown in top-view 1100A of FIG. 11A and in cross-sectional view 1100B of FIG. 11B, in some embodiments, the dummy gate electrode layers (702 of FIG. 10B) are selectively removed. In some embodiments, the selective removal process of FIGS. 11A and 11B comprises a wet etchant, such as, for example, hot phosphoric acid or some other suitable wet etchant that removes the dummy gate electrode layers (702 of FIG. 10B) and not the first sacrificial material 902 or the interconnect dielectric layers 102.

Figure 12A:
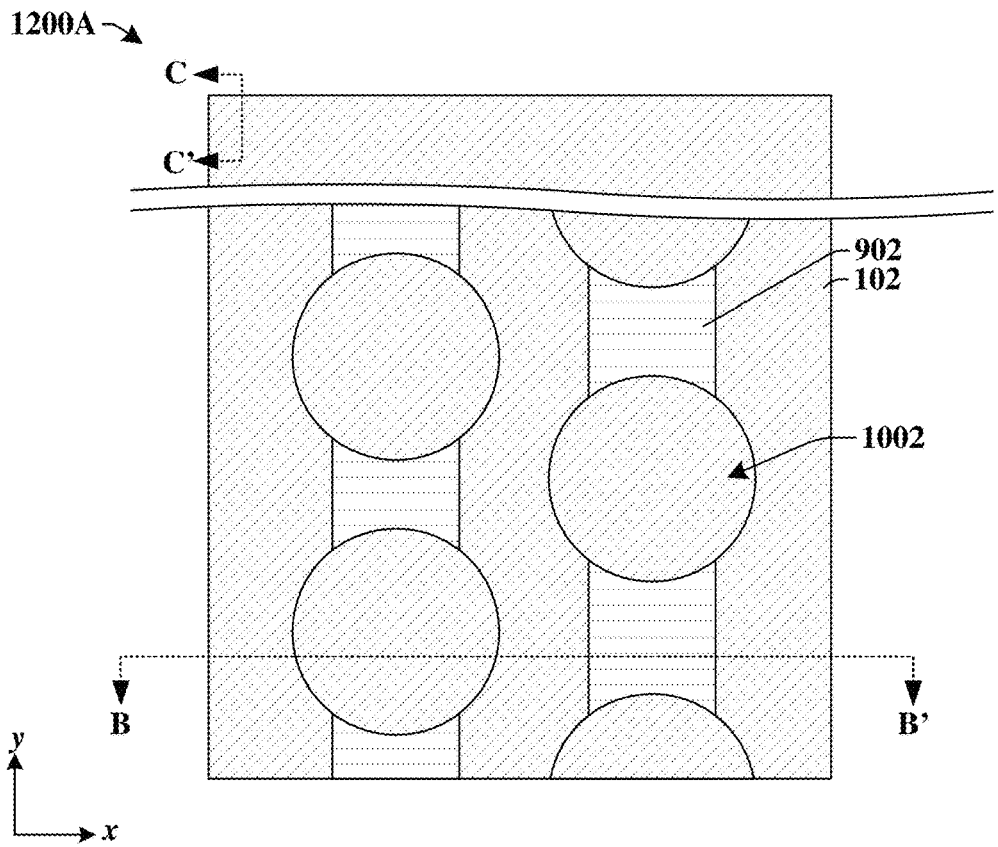
Figure 12B:
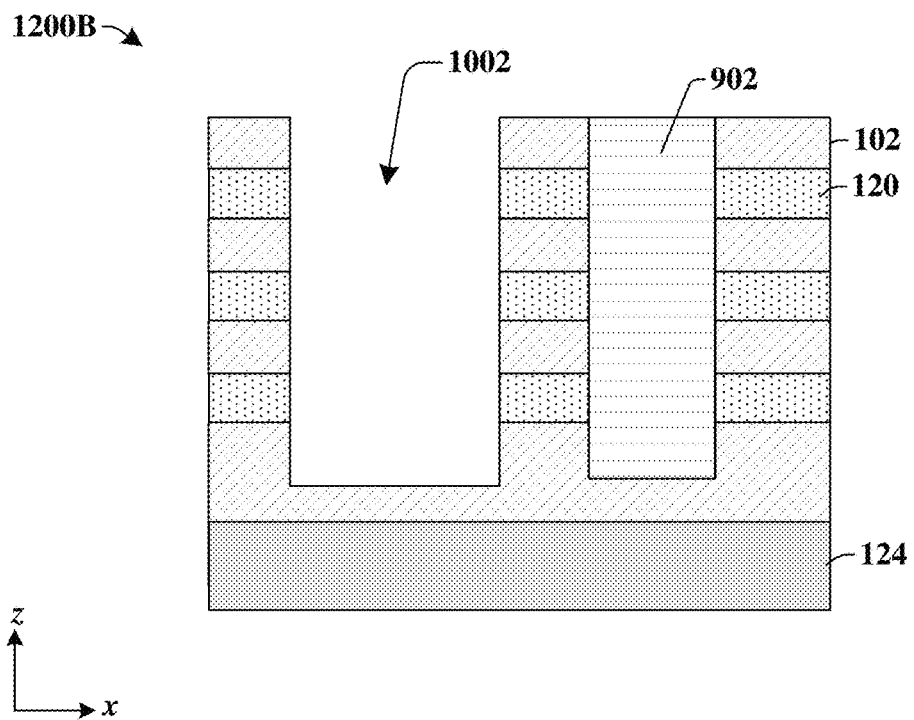

As shown in top-view 1200A of FIG. 12A and in cross-sectional view 1200B of FIG. 12B, in some embodiments, gate electrode layers 120 are formed where the dummy gate electrode layers (702 of FIG. 10B) were. In some embodiments, the gate electrode layers 120 are formed by way of a deposition process (e.g., PVD, CVD, ALD, sputtering, etc.). In some embodiments, the gate electrode layers 120 comprise, for example, titanium nitride, tungsten, tantalum nitride, copper, or some other suitable conductive metal. In some other embodiments, the gate electrode layers 120 may comprise polysilicon or some other suitable semiconductor materials.

Figure 12C:
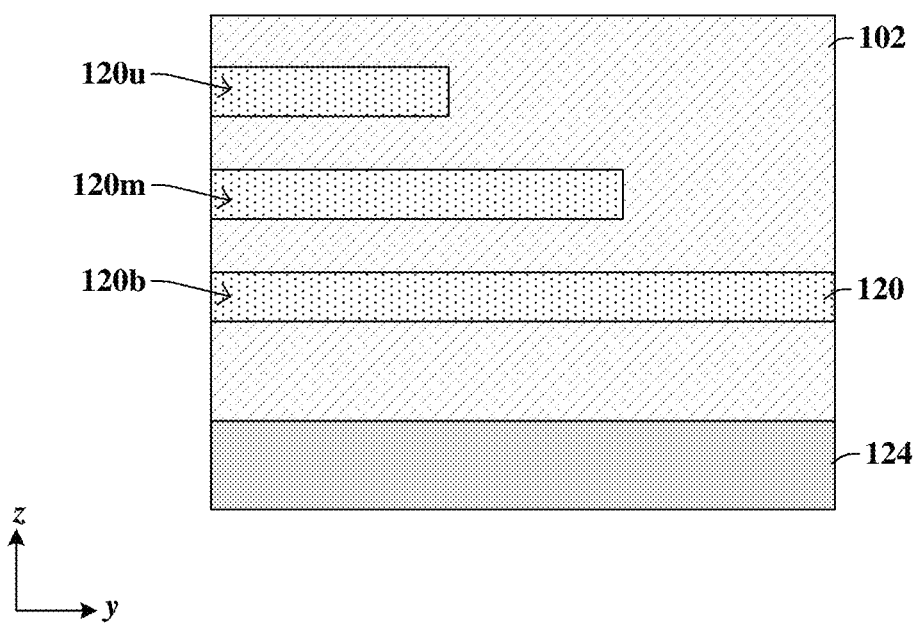

FIG. 12C illustrates a cross-sectional view 1200C of some embodiments corresponding to the gate electrode layers 120 in the yz-plane that corresponds to cross-section line CC' of FIG. 12A. The cross-section line CC' of FIG. 12A is taken from an area over the substrate 124 that does not directly underlie the first openings 1002 or the first sacrificial material 902.

As shown in the cross-sectional view 1200C of FIG. 12C, in some embodiments, the gate electrode layers 120 have different lengths in the y-direction. For example, a bottommost gate electrode layer 120$b$ is longer than an uppermost gate electrode layer 120$u$ and a middle gate electrode layer 120$m$ in the y-direction. Further, the middle gate electrode layer 120$m$ is longer than the uppermost gate electrode layer 120$u$ in the y-direction. The staggered arrangement of the gate electrode layers 120 is for the future formation of interconnect contacts coupled to each of the gate electrode layers 120 (see, e.g., FIG. 24C).

Figure 13A:
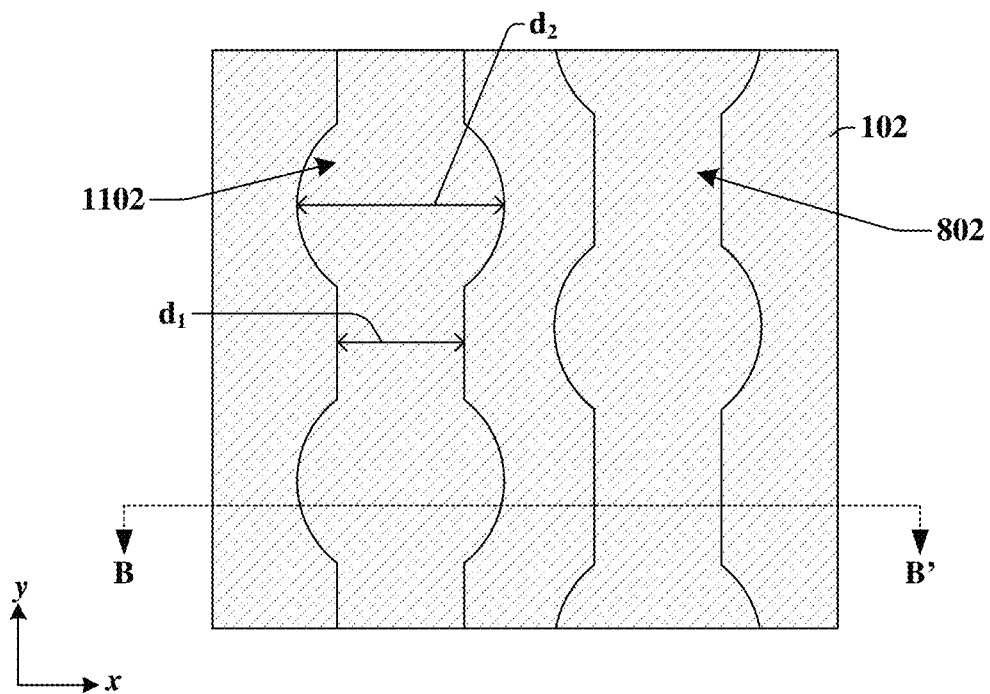
Figure 13B:
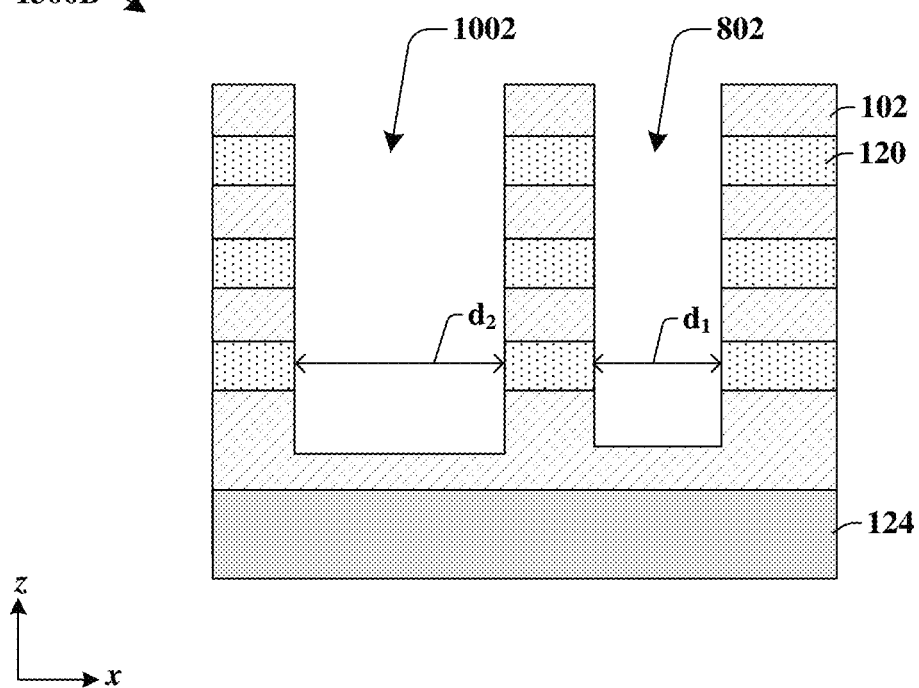

As shown in top-view 1300A of FIG. 13A and in cross-sectional view 1300B of FIG. 13B, in some embodiments, the first sacrificial material (902 of FIGS. 12A and 12B) is removed. In some embodiments, the removal process of FIGS. 13A and 13B comprises a wet or dry etchant that removes the first sacrificial material (902 of FIGS. 12A and 12B) without removing portions of the interconnect dielectric layers 102 or gate electrode layers 120. After the removal of the first sacrificial material (902 of FIGS. 12A and 12B), the trenches 802 and the first openings 1002 are again exposed and open, wherein the trenches 802 are connected to the first openings 1002, and wherein the trenches 802 are narrower than the first openings 1002.

Figure 14A:
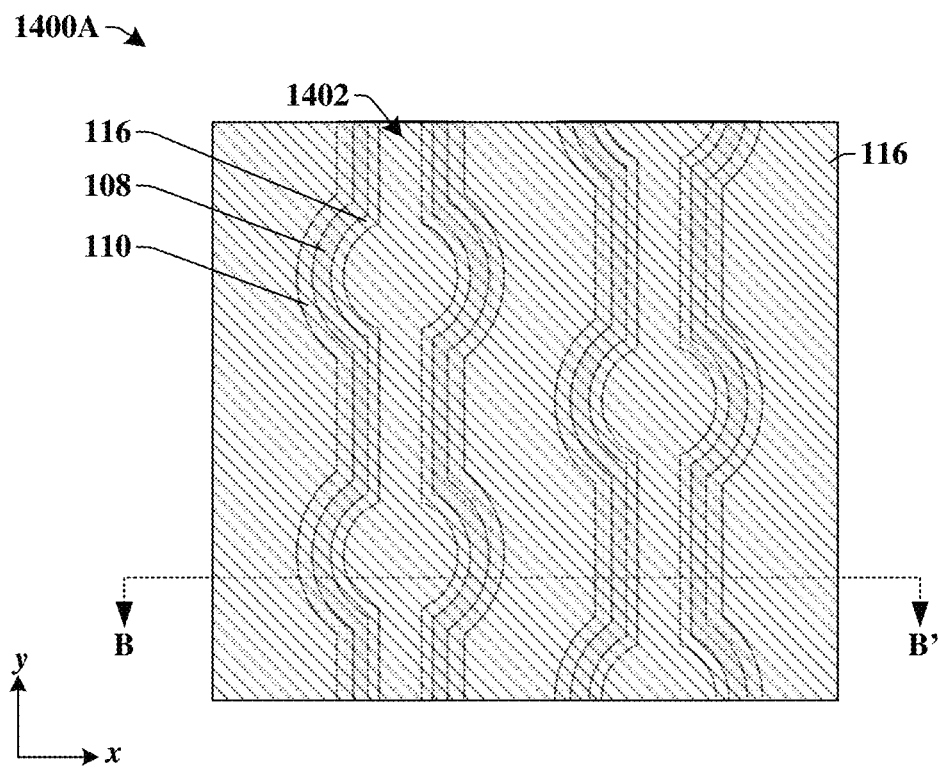
Figure 14B:
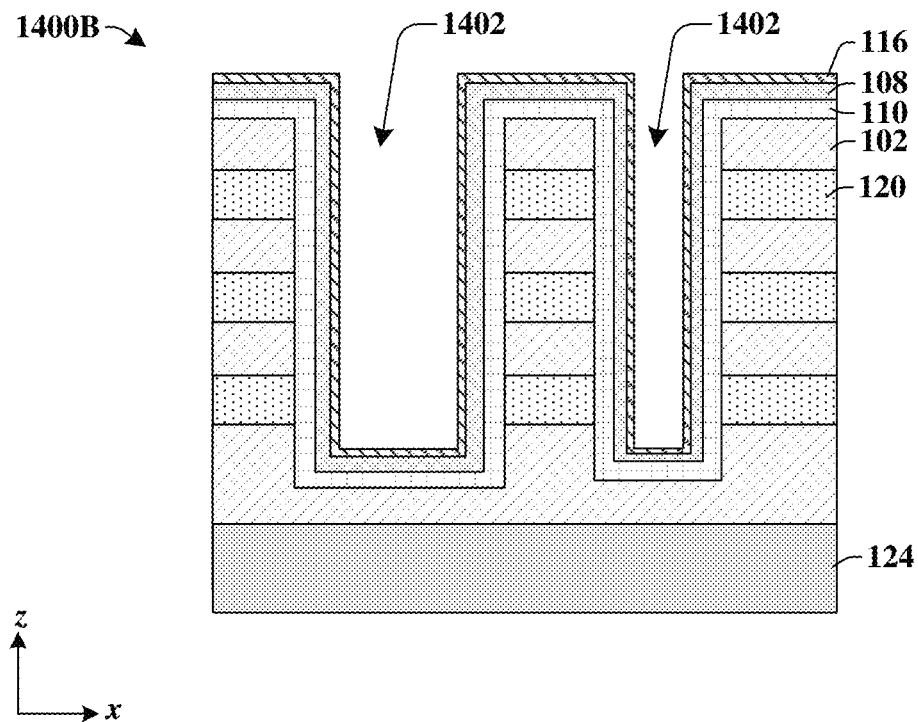

As shown in top-view 1400A of FIG. 14A and in cross-sectional view 1400B of FIG. 14B, in some embodiments, a memory layer 110 is formed within the trenches (802 of FIG. 13B) and the first openings (1002 of FIG. 13B). In some embodiments, the memory layer 110 lines the trenches (802 of FIG. 13B) and the first openings (1002 of FIG. 13B) and is formed by way of a deposition process (e.g., PVD, CVD, ALD, etc.). In some embodiments, the memory layer 110 comprises, for example, a silicon dioxide-silicon nitride-silicon dioxide (ONO) structure, a ferroelectric material (e.g., hafnium oxide, hafnium zinc oxide, etc.), or some other suitable memory storage material.

Further, in some embodiments, a channel layer 108 is formed over the memory layer 110. In some embodiments, the channel layer 108 is formed by way of a deposition process (e.g., PVD, CVD, ALD, etc.), and may comprise, for example, a semiconductor material such as, for example, poly-silicon, amorphous-silicon, oxide-semiconductor material, indium gallium zinc oxide, or some other suitable semiconductor material. In some embodiments, a first dielectric layer 116 is formed over the channel layer 108. In some embodiments, the first dielectric layer 116 is formed by way of a deposition process (e.g., PVD, CVD, ALD, etc.) and comprises, for example, aluminum oxide, hafnium oxide, or the like. In some embodiments, after the formation of the memory layer 110, the channel layer, and the first dielectric layer 116, space 1406 remains within the trenches (802 of FIG. 13B) and the first openings (1002 of FIG. 13B).

It will be appreciated that the first dielectric layer 116 is illustrated as somewhat transparent in the top-view 1400A of FIG. 14A to show the memory layer 110 and the channel layer 108 are also arranged below the first dielectric layer 116. Thus, in some embodiments, the first dielectric layer 116 may or may not actually be somewhat transparent from the top-view 1400A of FIG. 14A.

Figure 15A:
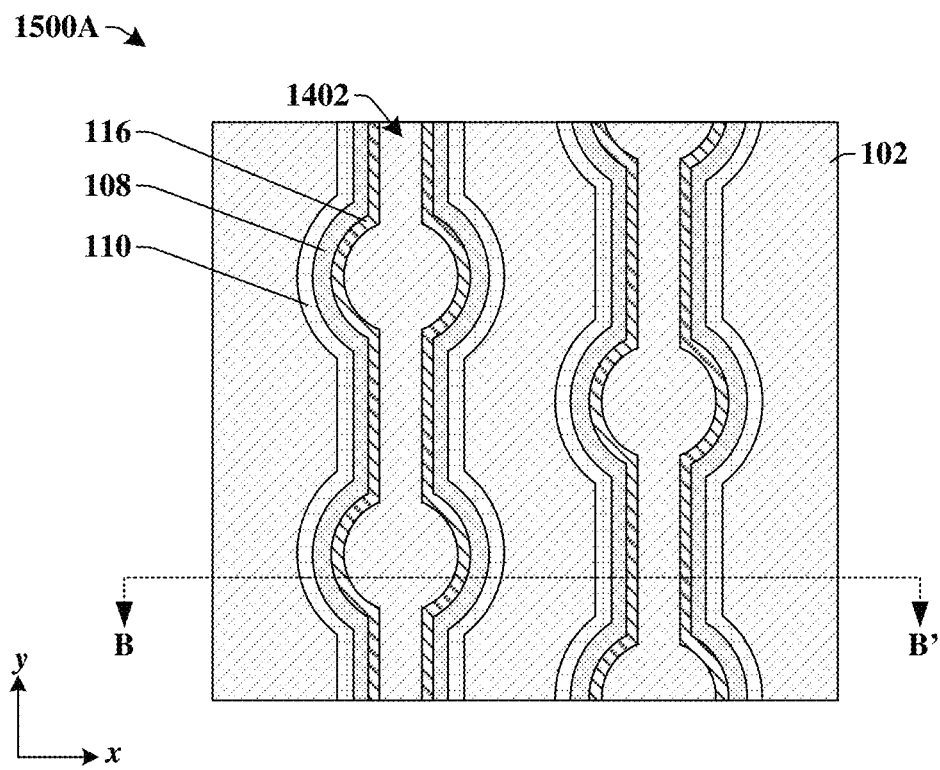
Figure 15B:
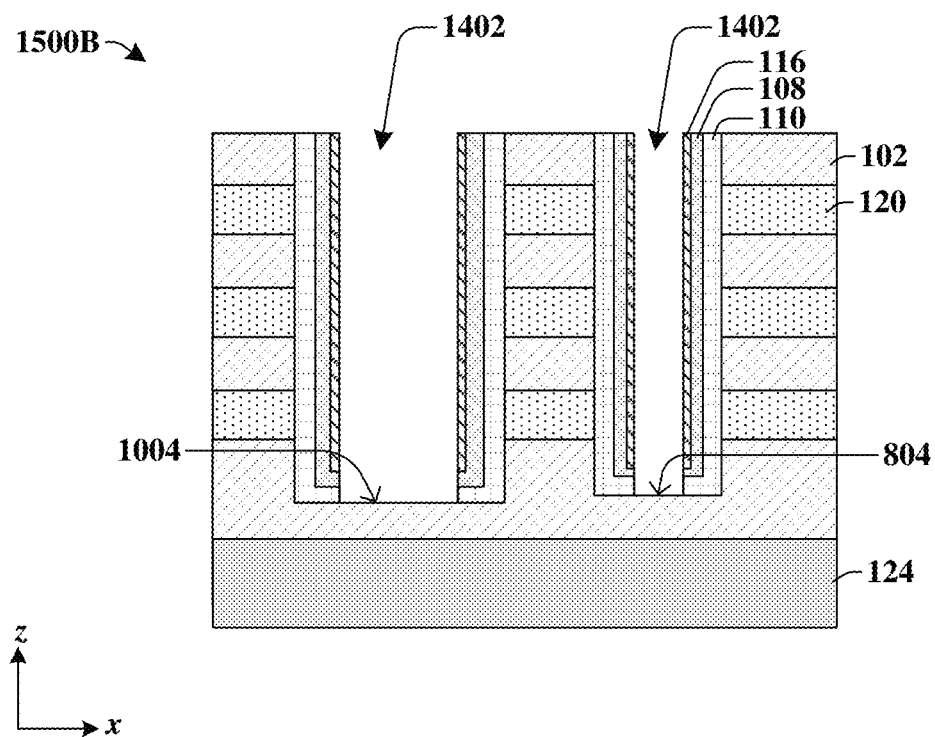

As shown in top-view 1500A of FIG. 15A and in cross-sectional view 1500B of FIG. 15B, in some embodiments, a vertical etching process is performed to remove substantially horizontal portions of the memory layer 110, the channel layer 108, and the first dielectric layer 116 to expose the uppermost one of the interconnect dielectric layers 102 and the first and second middle surfaces 804, 1004 of the bottommost one of the interconnect dielectric layers 102. In some such embodiments, a masking structure is not needed during the vertical etching process of FIGS. 15A and 15B. In some embodiments, multiple etchants are needed for the vertical etching process of FIGS. 15A and 15B because the memory layer 110, the channel layer 108, and the first dielectric layer 116 comprise different materials. In some other embodiments, a same etchant may be used for the vertical etching process of FIGS. 15A and 15B. Further, in some embodiments, the etchant(s) used for the vertical etching process of FIGS. 15A and 15B does not remove the interconnect dielectric layers 102.

Figure 16A:
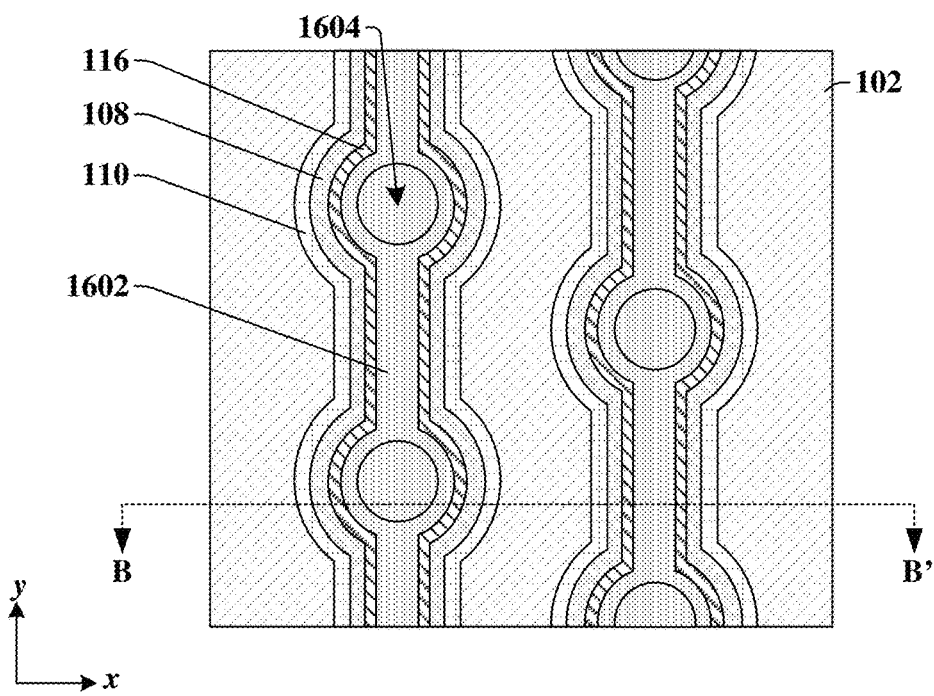
Figure 16B:
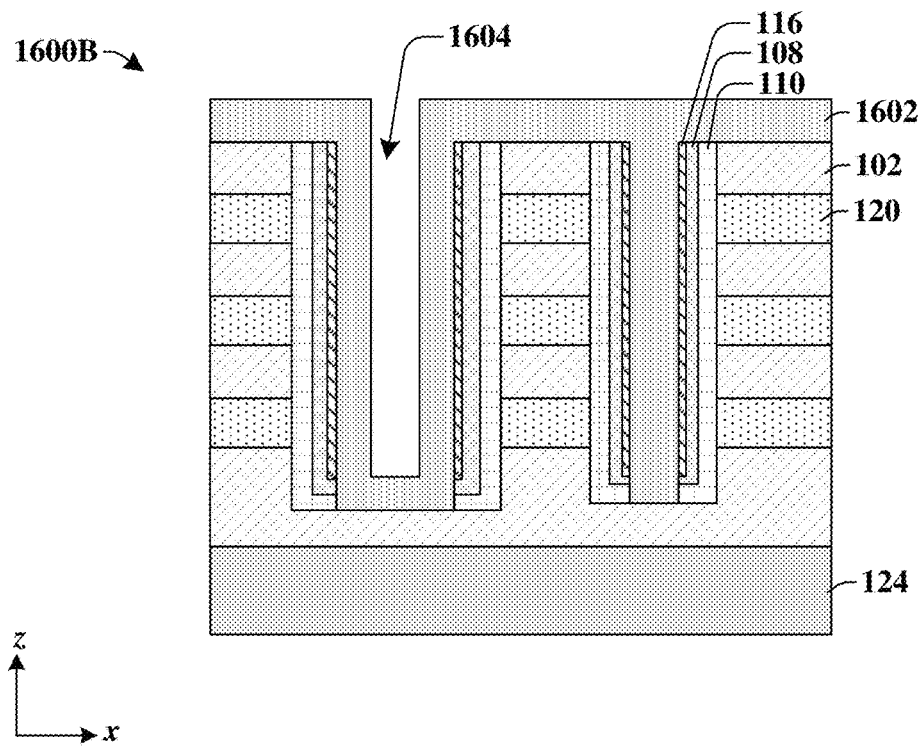

As shown in top-view 1600A of FIG. 16A and in cross-sectional view 1600B of FIG. 16B, in some embodiments, a second dielectric layer 1602 is formed over the uppermost one of the interconnect dielectric layers 102 and over the first dielectric layer 116, the channel layer 108, and the memory layer 110. In some embodiments, the second dielectric layer 1602 comprises, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the first dielectric layer 116 has a higher dielectric constant than the second dielectric layer 1602 and the interconnect dielectric layers 102.

In some embodiments, the second dielectric layer 1602 is formed by way of a deposition process (e.g., PVD, CVD, ALD, etc.). In some embodiments, the second dielectric layer 1602 is thick enough to completely fill the space (1406 of FIG. 15B) between the first dielectric layer 116 that is arranged in the trenches (802 of FIG. 13B). However, the second dielectric layer 1602 is thin enough such that an open region 1604 remains between the second dielectric layer 1602 arranged within the first openings (1002 of FIG. 13B).

Figure 17A:
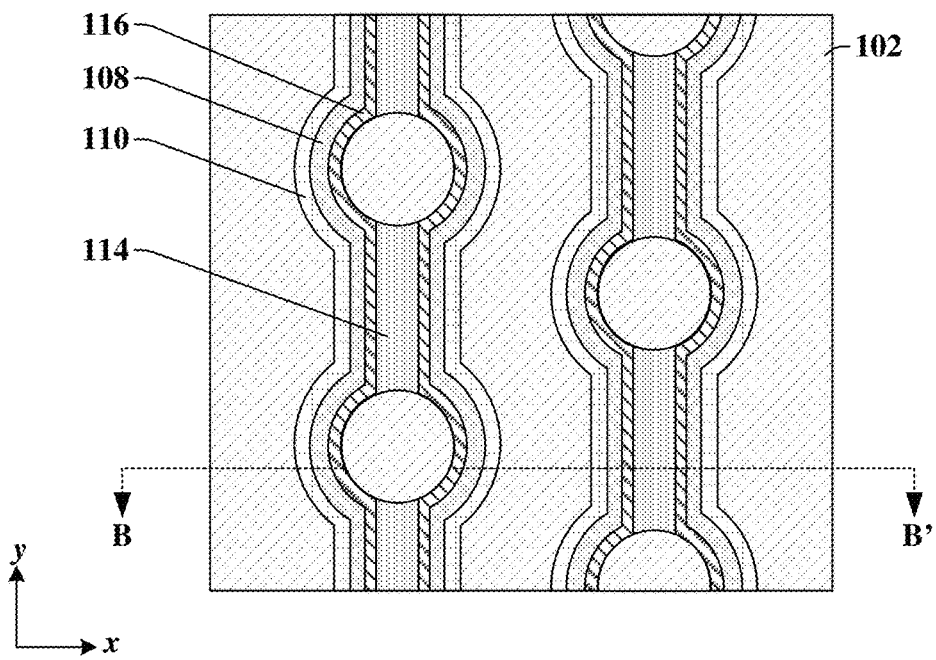
Figure 17B:
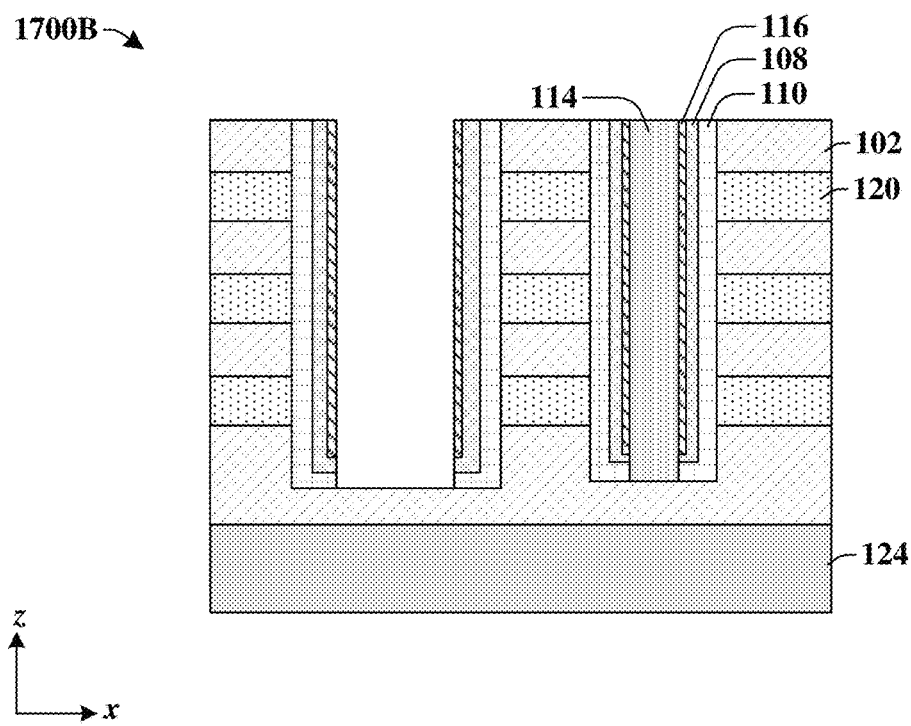

As shown in top-view 1700A of FIG. 17A and in cross-sectional view 1700B of FIG. 17B, in some embodiments, a removal process is performed to remove portions of the second dielectric layer (1602 of FIGS. 16A and 16B) that are arranged within the first openings (1002 of FIG. 13B). In such embodiments, the removal process comprises a wet or dry isotropic etchant that is controlled by, for example, time to remove an amount of the second dielectric layer (1602 of FIGS. 16A and 16B) equal to the thickness of the second dielectric layer (1602 of FIGS. 16A and 16B). In some embodiments, the interconnect dielectric layers 102 and the first dielectric layer 116 are substantially resist to removal by the isotropic etchant. In some embodiments, the remaining second dielectric layer (1602 of FIGS. 16A and 16B) form a barrier structure 114 within the trenches (802 of FIG. 13B).

Because of the differing widths of the trenches (802 of FIG. 13B) and the first openings (1002 of FIG. 13B), the open region (1604 of FIG. 16B) allows the isotropic etch of FIG. 17B to remove portions of the second dielectric layer (1602 of FIGS. 16A and 16B) arranged within the first openings (1002 of FIG. 13B) but not within the trenches (802 of FIG. 13B). In some such embodiments, a masking structure is not needed in FIGS. 17A and 17B. In some other embodiments (not shown), a small, upper portion of the second dielectric layer (1602 of FIG. 16B) may be removed from the trenches (802 of FIG. 13B) such that the barrier structure 114 has a topmost surface arranged just below topmost surfaces of the first dielectric layer 116.

Figure 18A:
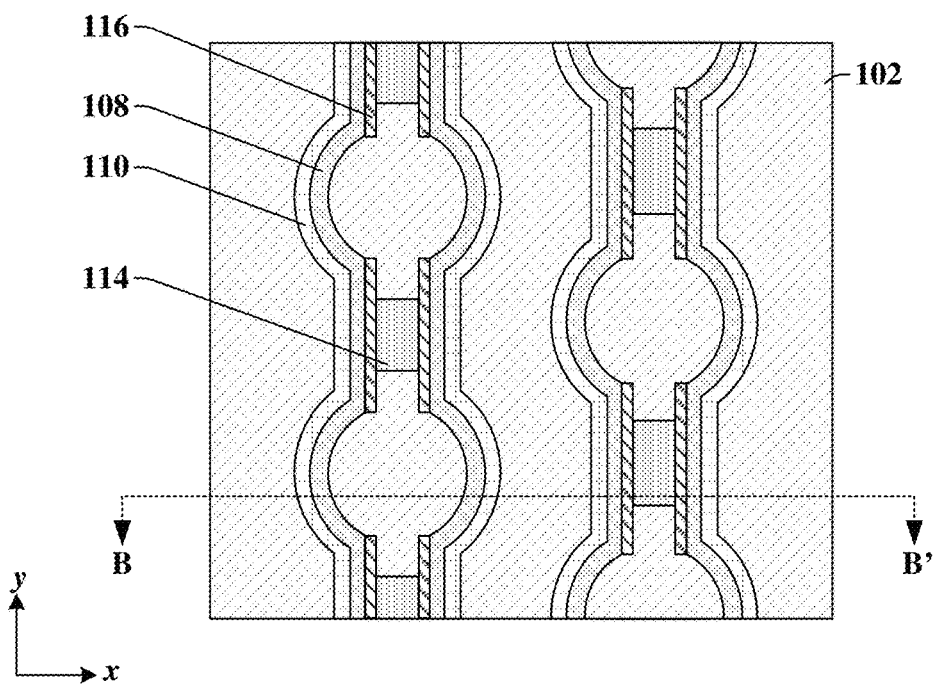
Figure 18B:
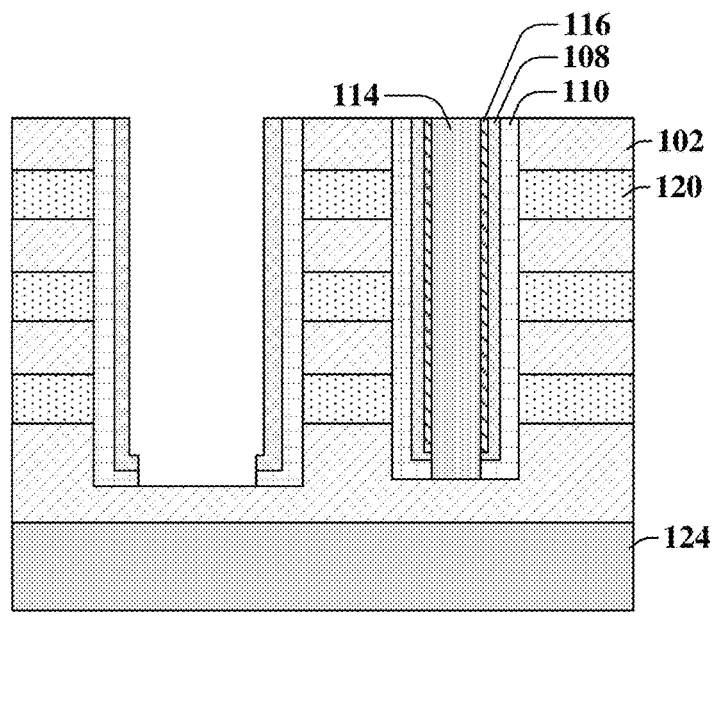

As shown in top-view 1800A of FIG. 18A and in cross-sectional view 1800B of FIG. 18B, in some embodiments, a removal process is performed to remove portions of the first dielectric layer 116 arranged within the first openings (1002 of FIG. 13B). In such embodiments, the removal process of FIGS. 18A and 18B comprises a wet or dry isotropic etchant that removes the thickness of the first dielectric layer 116 within the first openings (1002 of FIG. 13B). In some embodiments, the first dielectric layer 116 arranged within the trenches (802 of FIG. 13B) is substantially resist to removal by the removal process of FIGS. 18A and 18B because the first dielectric layer 116 arranged within the trenches (802 of FIG. 13B) is covered by the barrier structures 114.

In some embodiments, the removal process of FIGS. 18A and 18B comprises a low or no bias bombardment etching process to prevent damage to the channel layer 108 when the channel layer 108 is exposed to the low or no bias bombardment etching process upon removal of the portions of the first dielectric layer 116.

Further, in some embodiments, an additional removal process is performed to remove portions of the barrier structure 114 in the x-direction. In some such embodiments, the first dielectric layer 116 is substantially resistant to the additional removal process. In some other embodiments, the additional removal process is omitted, such that the barrier structure 114 is not reduced in size in the y-direction.

In some other embodiments (not shown), upper portions of the barrier structure 114 and/or the first dielectric layer 116 arranged within the trenches (802 of FIG. 13B) may be residually removed by the removal process of FIGS. 18A and 18B such that topmost surfaces of the barrier structure 114 and/or the first dielectric layer 116 are arrange below topmost surfaces of the memory layer 110 and the channel layer 108.

Figure 19A:
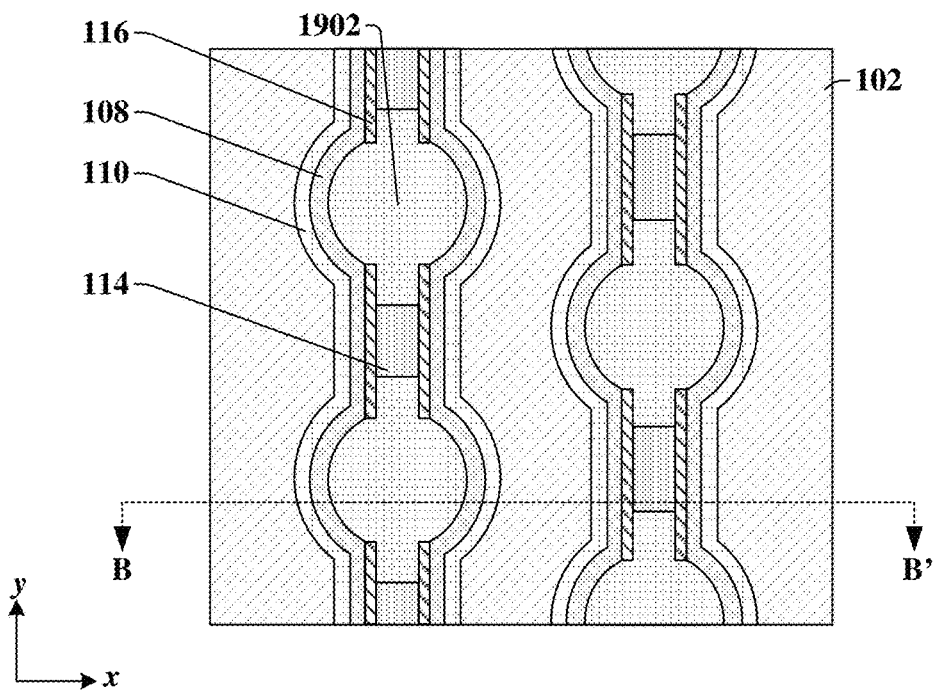
Figure 19B:
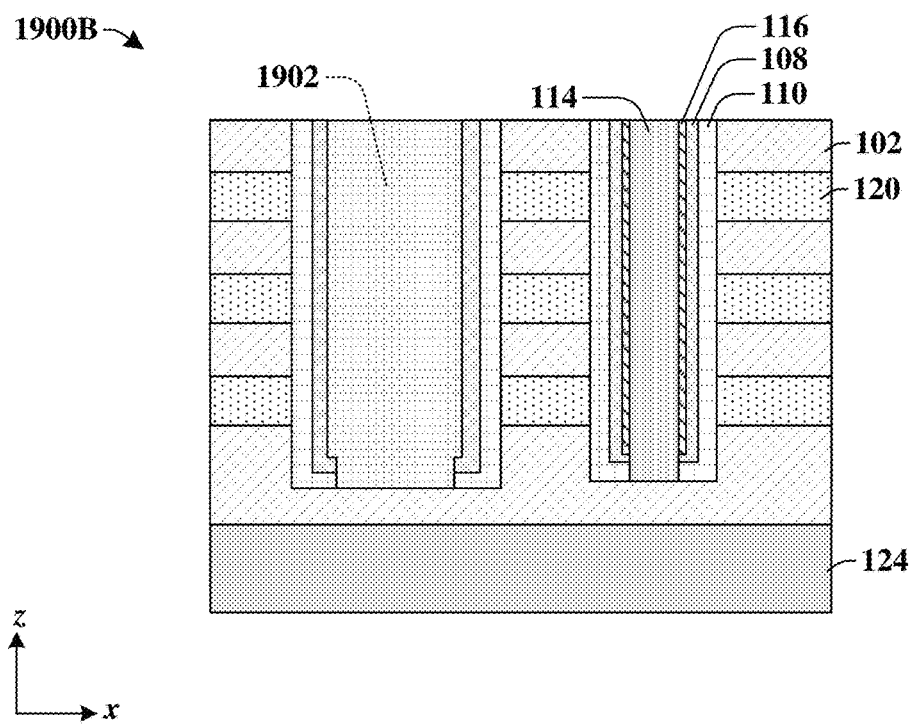

As shown in top-view 1900A of FIG. 19A and in cross-sectional view 1900B of FIG. 19B, in some embodiments, a second sacrificial material 1902 is formed within open regions of the first openings (1002 of FIG. 13B) and/or within open regions of the trenches (802 of FIG. 13B). In some embodiments, the second sacrificial material 1902 is formed by way of a deposition process (e.g., PVD, CVD, ALD, etc.) followed by a removal process (e.g., CMP) to remove excess portions of the second sacrificial material 1902 arranged over the uppermost one of the interconnect dielectric layers 102.

Figure 20A:
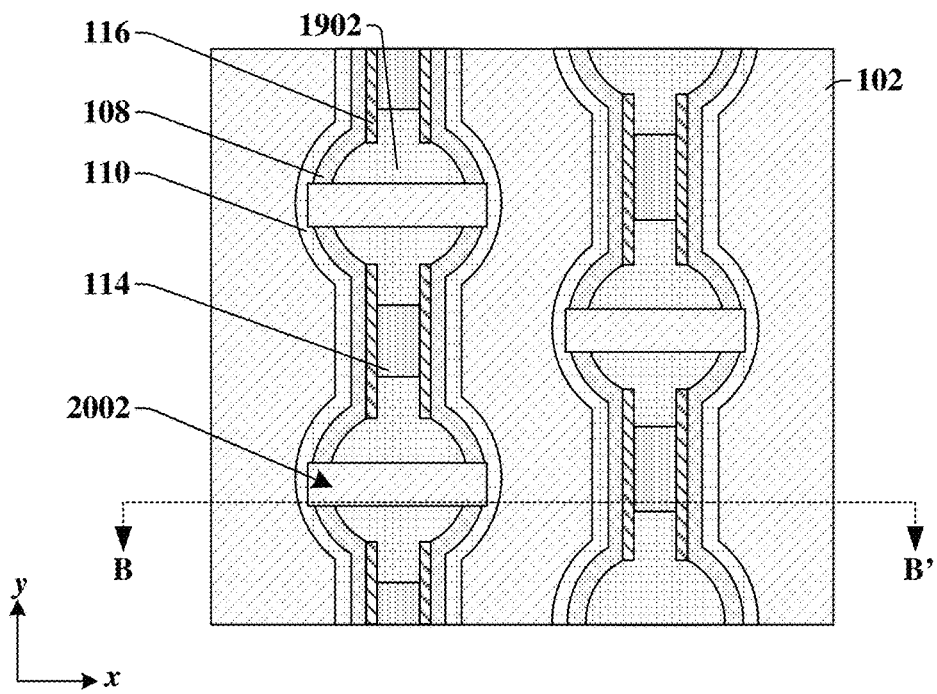
Figure 20B:
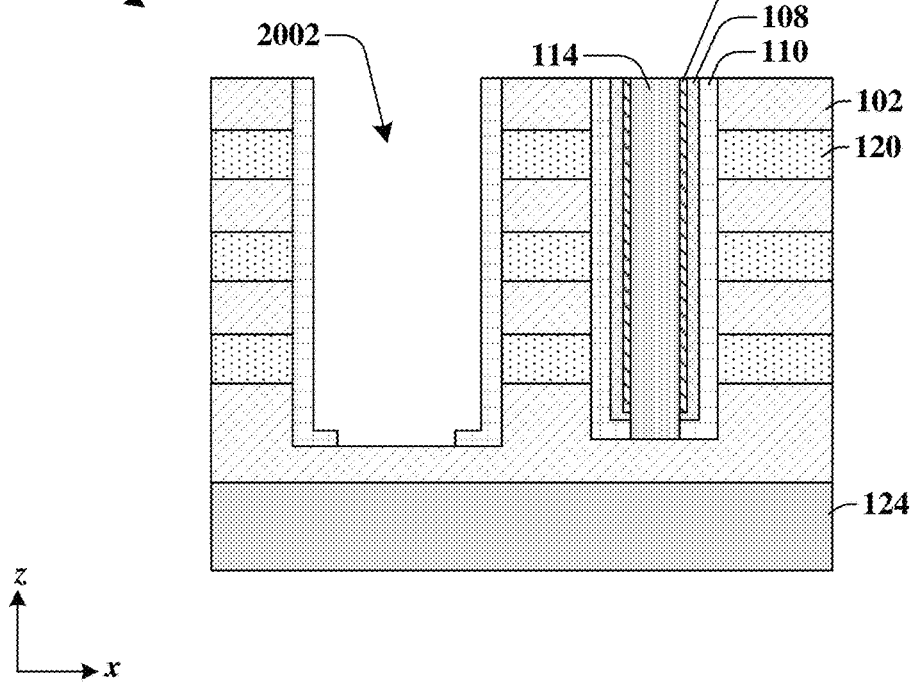

As shown in top-view 2000A of FIG. 20A and in cross-sectional view 2000B of FIG. 20B, portions of the second sacrificial material 1902 and the channel layer 108 are removed from the first openings (1002 of FIG. 13B), thereby forming second openings 2002 in the second sacrificial material 1902 and the channel layer 108. In some embodiments, the second openings 2002 are formed by way of a masking structure patterned according to a photolithography process. In some embodiments, then, portions of the second sacrificial material 1902 and the channel layer 108 are removed according to the masking structure.

Figure 21A:
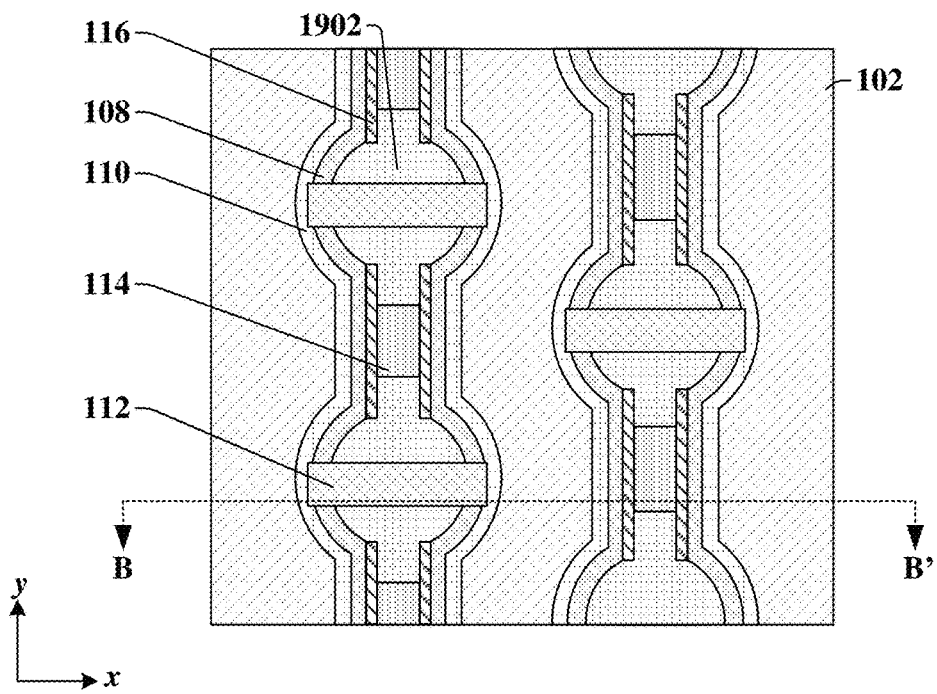
Figure 21B:
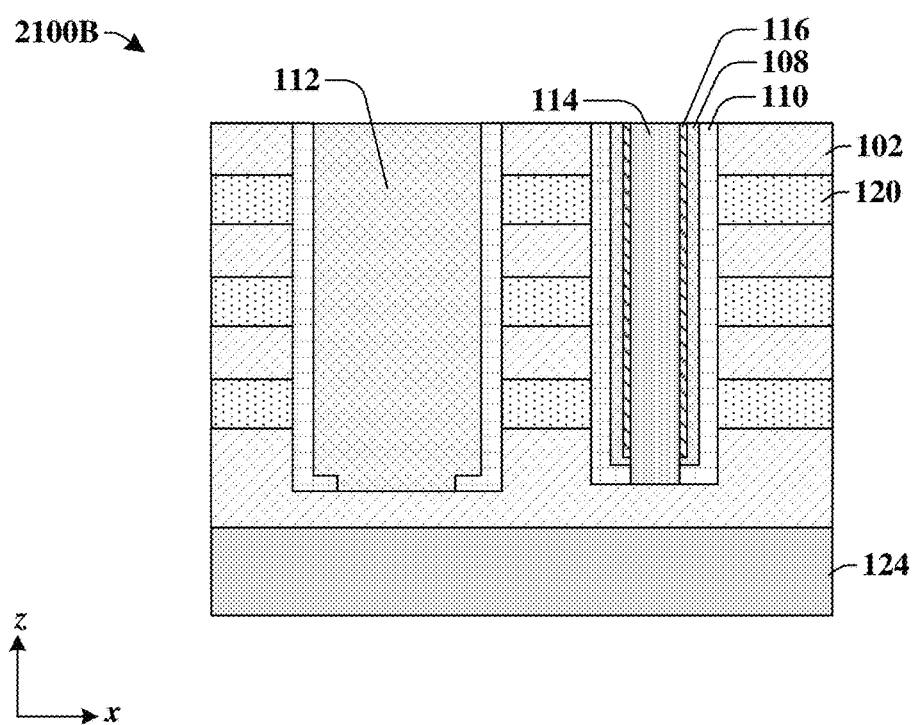

As shown in top-view 2100A of FIG. 21A and in cross-sectional view 2100B of FIG. 21B, cell isolation structures 112 are formed within the second openings (2002 of FIGS. 20A and 20B). In some embodiments, the cell isolation structures 112 are formed by way of a deposition process (e.g., PVD, CVD, ALD, etc.) followed by a removal process (e.g., CMP) to remove excess portions of the cell isolation structures 112 arranged over the uppermost one of the interconnect dielectric layers 102. In some embodiments, the cell isolation structures 112 comprise a dielectric material such as, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like.

Figure 22A:
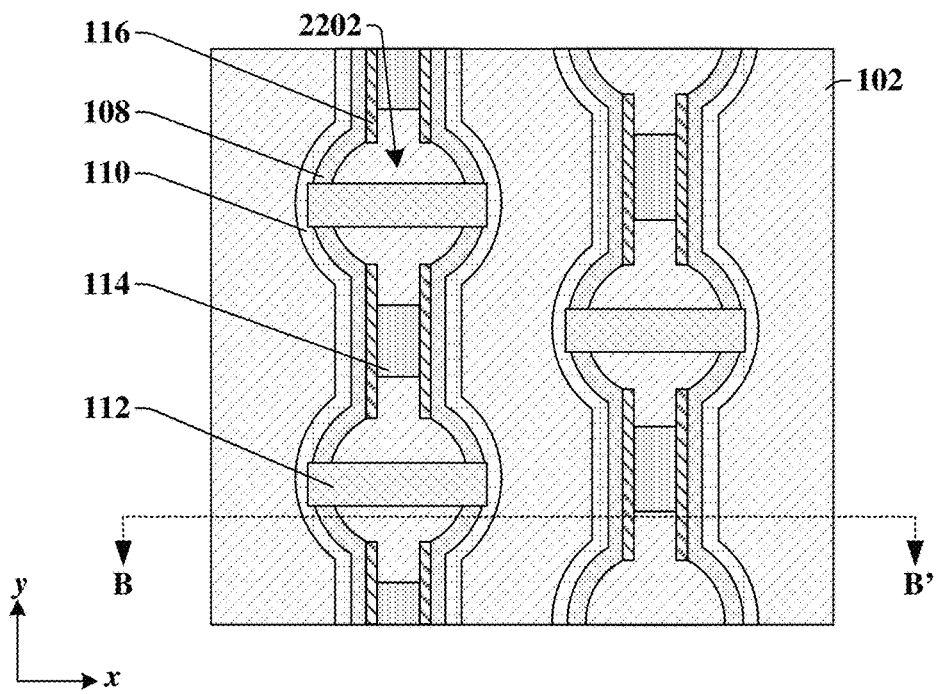
Figure 22B:
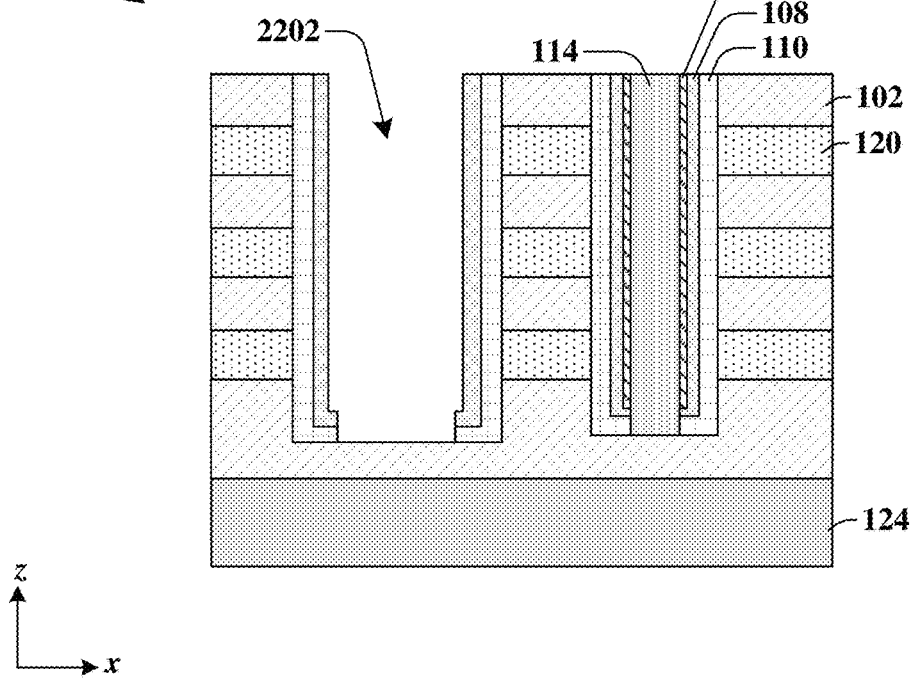

As shown in top-view 2200A of FIG. 22A and in cross-sectional view 2200B of FIG. 22B, in some embodiments, the second sacrificial material (1902 of FIGS. 21A and 21B) is removed. In some embodiments, the second sacrificial material (1902 of FIGS. 21A and 21B) may be removed by a wet or dry etching process.

Figure 23A:
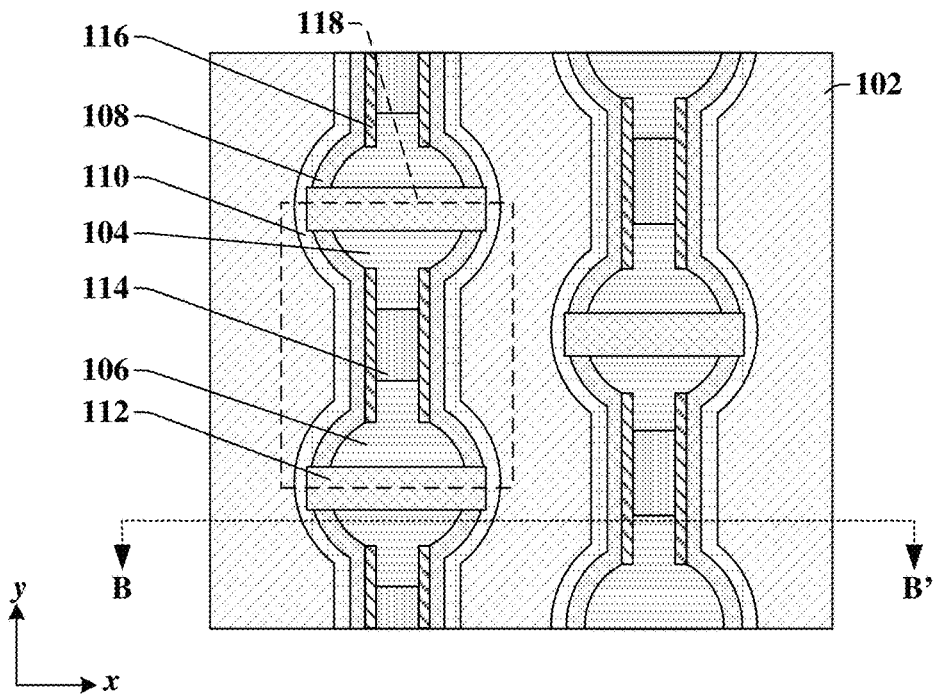
Figure 23B:
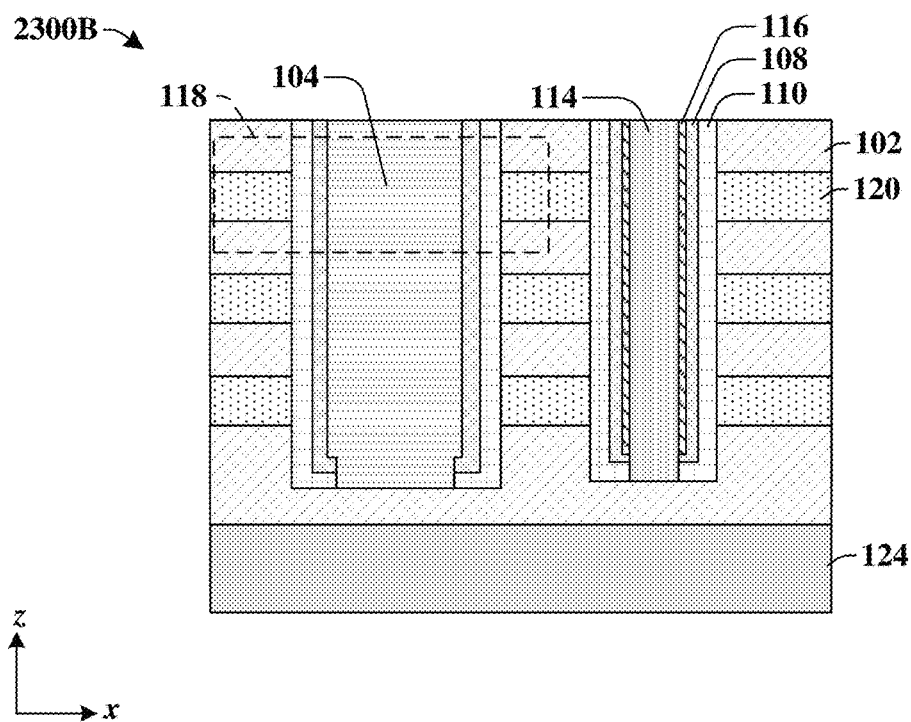

As shown in top-view 2300A of FIG. 23A and in cross-sectional view 2300B of FIG. 23B, a conductive material is formed where the second sacrificial material (1902 of FIGS. 21A and 21B) was to fill remaining open regions in the trenches (802 of FIG. 13B) and the first openings (1002 of FIG. 13B) to form source conductive lines 104 and drain conductive lines 106 within the first openings (1002 of FIG. 13B). In some embodiments, the conductive material of the source and drain conductive lines 104, 106 comprises, for example, titanium nitride, tungsten, tantalum nitride, copper, or some other suitable conductive metal. In some embodiments, the conductive material of the source and drain conductive lines 104, 106 is formed by way of a deposition process (e.g., PVD, CVD, ALD, sputtering, etc.) followed by a removal process (e.g., CMP) to remove excess portions of the conductive material arranged over the uppermost one of the interconnect dielectric layers 102.

The source conductive line 104, the drain conductive line 106, the barrier structure 114, one of the gate electrode layers 120, the channel layer 108, the memory layer 110, and the first dielectric layer 116 are part of a memory cell 118 of a 3D NOR type memory array, wherein the memory cells 118 are arranged in the x, y, and z directions. Within the memory cell 118, in some embodiments, the source conductive line 104 is spaced apart from the drain conductive line 106 by the barrier structure 114. In some embodiments, between memory cells 118 in the y-direction, memory cells 118 are spaced apart by the cell isolation structures 112.

In some other embodiments, memory cells 118 arranged next to one another in the y-direction share source and/or drain conductive lines 104, 106, and thus, the cell isolation structures 112 are omitted (see, e.g., FIGS. 5 and 6). In such other embodiments, the steps illustrated in FIGS. 19A-22B to form the cell isolation structures 112 are omitted from the method.

Figure 24A:
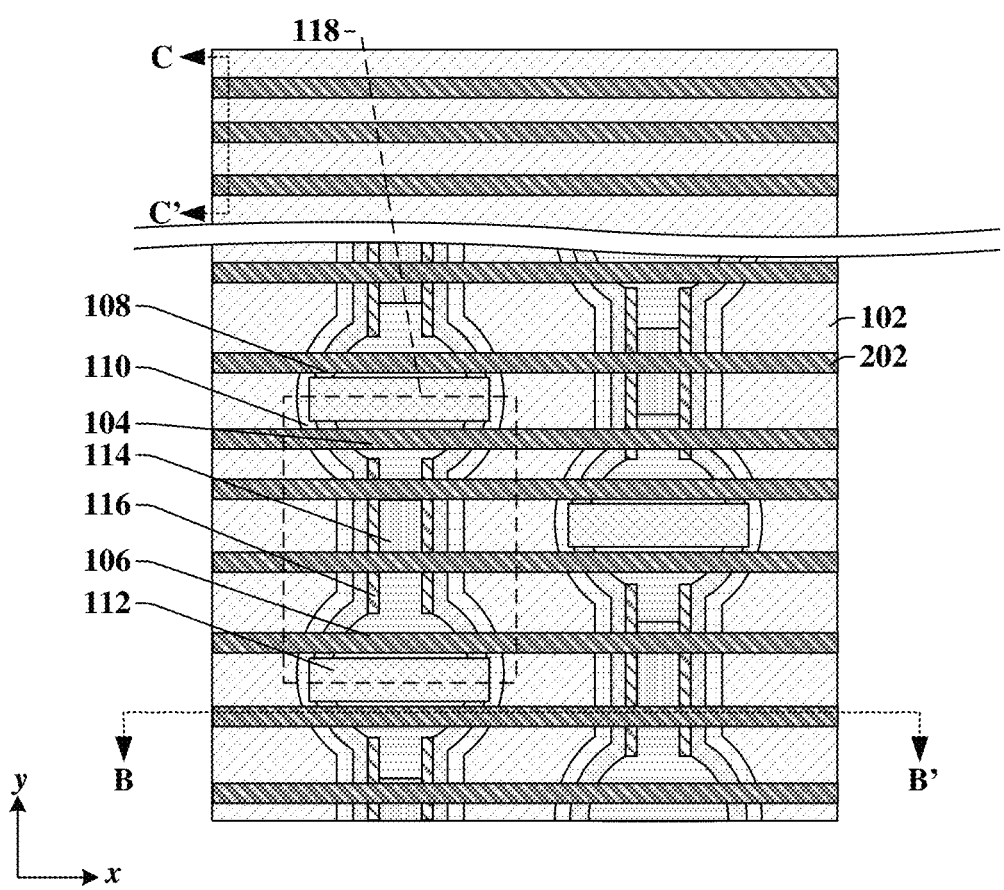
Figure 24B:
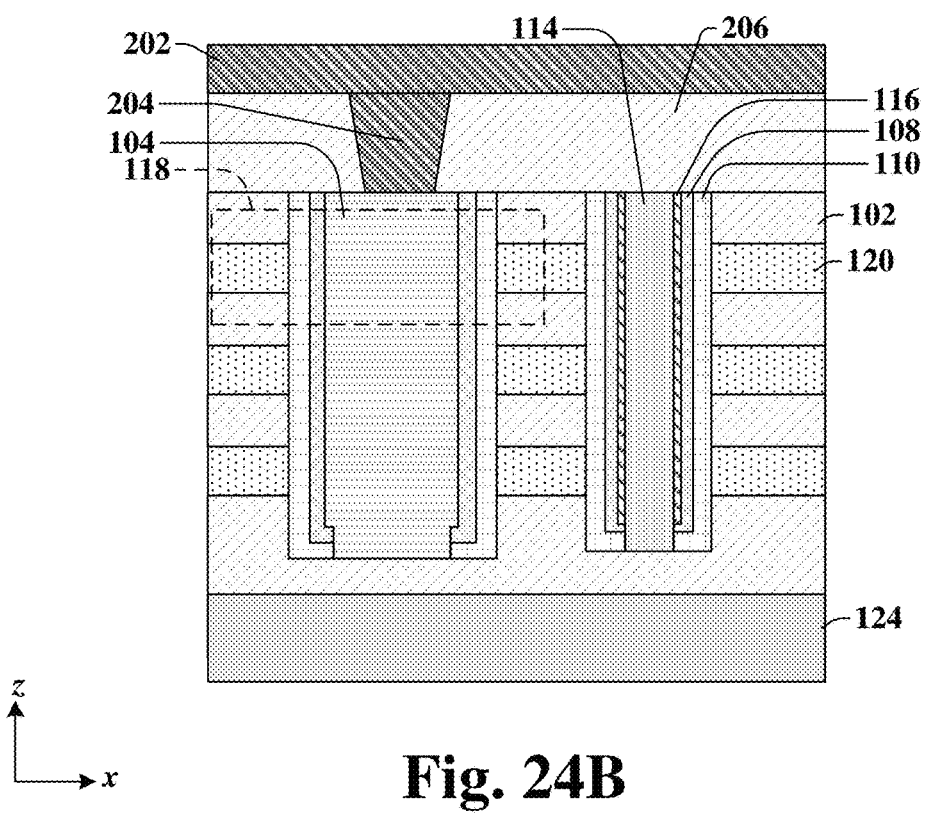
Figure 24C:
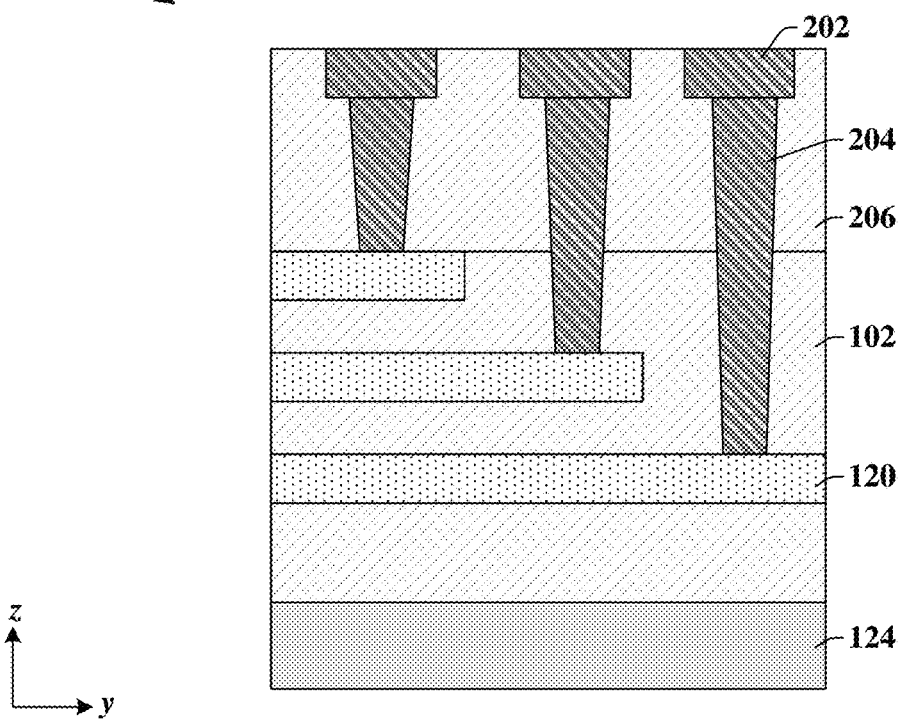

As shown in top-view 2400A of FIG. 24A and in cross-sectional views 2400B and 2400C of FIGS. 24B and 24C, respectively, an interconnect structure is formed over the memory cells 118. In some embodiments, the interconnect structure comprises interconnect conductive lines 202 that extend in the x-direction coupled the source conductive line 104, the drain conductive line 106, and the gate electrode layers 120 through interconnect contacts 204. In some embodiments, the interconnect conductive lines 202 and the interconnect contacts 204 are formed within an interconnect structure dielectric layer 206 arranged over the uppermost one of the interconnect dielectric layers 102. It will be appreciated that the interconnect structure dielectric layer 206 is omitted from the top-view 2400A of FIG. 24A for ease of understanding how the interconnect conductive lines 202 overlay the memory cells 118.

In some embodiments, interconnect structure dielectric layer 206, the interconnect conductive lines 202, and the interconnect contacts 204 are formed through various steps of deposition (e.g., PVD, CVD, ALD, sputtering, etc.), photolithography, and removal processes (e.g., etching, CMP, etc.). In some embodiments, the interconnect structure dielectric layer 206 comprises, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the interconnect conductive lines 202 and the interconnect contacts 204 comprise, for example, tungsten, aluminum, copper, tantalum, titanium, or some other suitable conductive material. In some embodiments, the interconnect contacts 204 coupled to the gate electrode layers 120 have different lengths measured in the z-direction to contact the staggered gate electrode layers 120.

In some embodiments, the interconnect conductive lines 202 coupled to the source conductive lines 104 are associated with source-lines (SL of FIG. 2D); the interconnect conductive lines 202 coupled to the drain conductive lines 106 are associated with bit-lines (BL of FIG. 2D); and the interconnect conductive lines 202 coupled to the gate electrode layers 120 are associated with word-lines (WL of FIG. 2D). Each memory cell 118 may be accessed through control circuitry (e.g., 208 and 210 of FIG. 210) that selectively applies signals (e.g., current, voltage) to a word-line (WL of FIG. 2D), source-line (SL of FIG. 2D), and bit-line (BL of FIG. 2D) coupled to the memory cell 118 to be accessed. Based on mobile charge carriers that flow through the channel layer 108, a data state may be read from or written to the memory layer 110 of the accessed memory cell 118. Because of the wider first openings (1002 of FIG. 13B) and the low-damage etching process to remove portions of the first dielectric layer 116 in FIGS. 18A and 18B, damage to the channel and memory layers 108, 110 is reduced, thereby increasing reliability of the overall memory cells 118 in the final 3D NOR type memory array.

Figure 25:
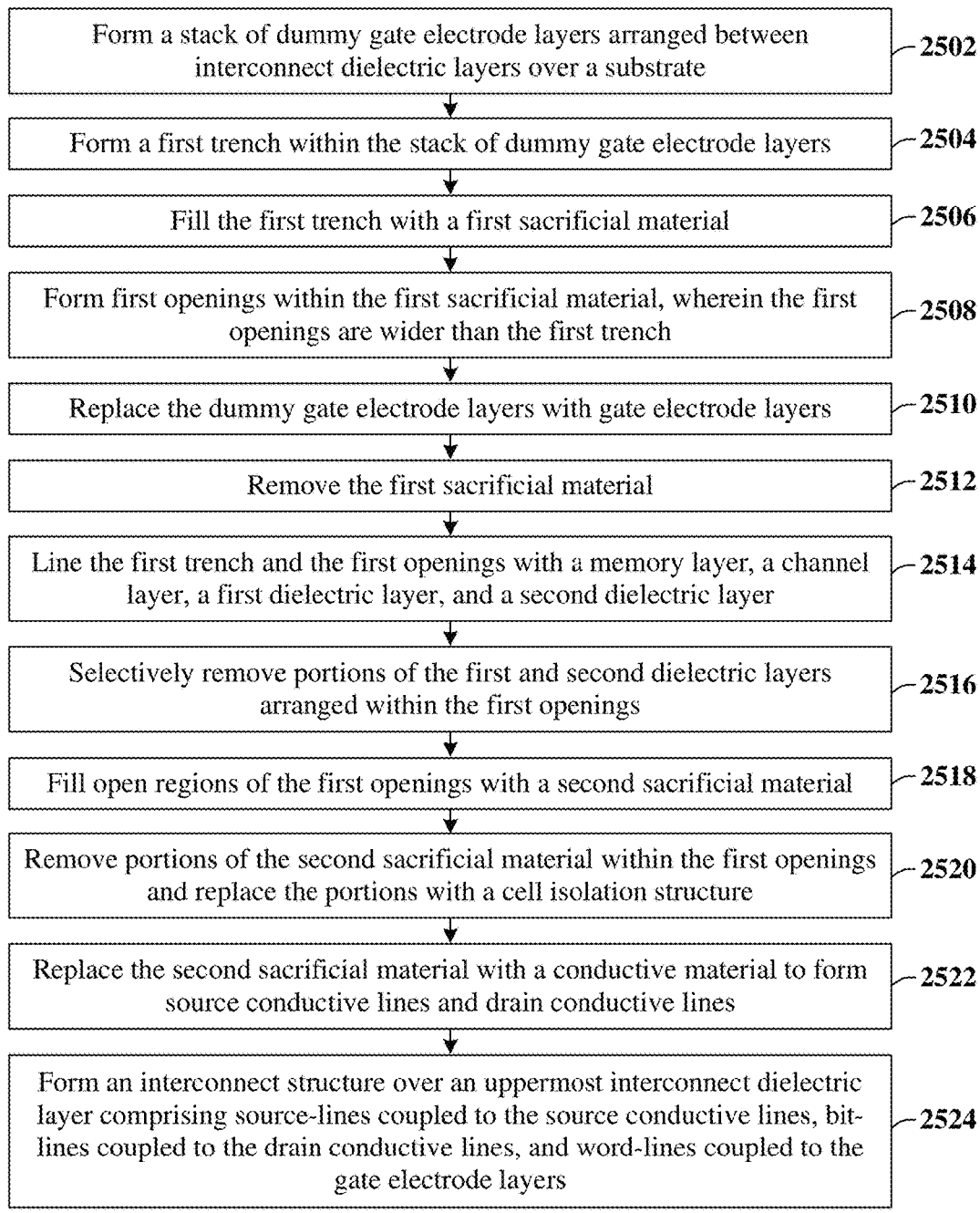
FIG. 25 illustrates a flow diagram of some embodiments corresponding to the method of FIGS. 7A-24C.

FIG. 25 illustrates a flow diagram of some embodiments of a method 2500 corresponding to the method illustrated in FIGS. 7A-24C.

While method 2500 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2502, a stack of dummy gate electrode layers is formed, and each dummy gate electrode layer is arranged between interconnect dielectric layers over a substrate. FIG. 7B illustrates a cross-sectional view 700B of some embodiments corresponding to act 2502.

At act 2504, a first trench is formed within the stack of dummy gate electrode layers. FIG. 8B illustrates a cross-sectional view 800B of some embodiments corresponding to act 2504.

At act 2506, the first trench is filled with a first sacrificial material. FIG. 9B illustrates a cross-sectional view 900B of some embodiments corresponding to act 2506.

At act 2508, first openings are formed within the first sacrificial material, wherein the first openings are wider than the first trench. FIG. 10A illustrates top-view 100A and FIG. 10B illustrates cross-sectional view 1000B of some embodiments corresponding to act 2508.

At act 2510, the dummy gate electrode layers are replaced with gate electrode layers. FIGS. 11B and 12B respectively illustrate cross-sectional views 1100B and 1200B of some embodiments corresponding to act 2510.

At act 2512, the first sacrificial material is removed. FIG. 13B illustrates cross-sectional view 1300B of some embodiments corresponding to act 2512.

At act 2514, the first trench and first openings are lined with a memory layer, a channel layer, a first dielectric layer, and a second dielectric layer. FIG. 16B illustrates cross-sectional view 1600B of some embodiments corresponding to act 2514.

At act 2516, portions of the first and second dielectric layers that are arranged within the first openings are selectively removed. FIGS. 17B and 18B respectively illustrate cross-sectional views 1700B and 1800B of some embodiments corresponding to act 2516.

At act 2518, open regions of the first openings are filled with a second sacrificial material. FIG. 19B illustrates cross-sectional view 1900B of some embodiments corresponding to act 2518.

At act 2520, portions of the second sacrificial material within the first openings are removed and replaced with a barrier structure. FIGS. 20B and 21B respectively illustrate cross-sectional views 2000B and 2100B of some embodiments corresponding to act 2520.

At act 2522, the second sacrificial material is replaced with a conductive material to form source conductive lines and drain conductive lines. FIG. 23A illustrates a top-view 2300A of some embodiments corresponding to act 2522.

At act 2524, an interconnect structure is formed over an uppermost interconnect dielectric layer and comprises source-lines coupled to the source conductive lines, bit-lines coupled to the drain conductive lines, and word-lines coupled to the gate electrode layers. FIGS. 24A, 24B, and 24C illustrate various views 2400A, 2400B, and 2400C of some embodiments corresponding to act 2524.

Therefore, the present disclosure relates to a method of forming a 3D NOR type memory array by forming openings in an interconnect dielectric and gate electrode layer structure for the formation of source/drain conductive lines before depositing channel and memory layers to mitigate damage to the channel and memory layers, thereby increasing reliability of the final 3D NOR type memory array.

Accordingly, in some embodiments, the present disclosure relates to a memory device comprising: a stack of gate electrode layers arranged over a substrate; interconnect dielectric layers arranged above and below each gate electrode layer; a first memory cell arranged over the substrate and comprising: a first source/drain conductive line extending vertically through the stack of gate electrode layers; a second source/drain conductive line extending vertically through the stack of gate electrode layers; a barrier structure arranged between the first source/drain conductive line and the second source/drain conductive line; a channel layer arranged on outermost sidewalls of the first source/drain conductive line and the second source/drain conductive line; a first dielectric layer arranged between the barrier structure and the channel layer, wherein outermost sidewalls of the first dielectric layer directly contact the channel layer; and a memory layer arranged on outer sidewalls of the channel layer, wherein the first dielectric layer has a first width that is a maximum distance between outermost sidewalls of the first dielectric layer, wherein the first source/drain conductive line has a second width that is a maximum distance between the outermost sidewalls of the first source/drain conductive line, and wherein the second width is greater than the first width.

In other embodiments, the present disclosure relates to a memory device comprising: a first memory cell arranged over a substrate and comprising: a first source/drain conductive line extending through a stack of gate electrode layers alternating with interconnect dielectric layers that is arranged over the substrate; a second source/drain conductive line extending through the stack of gate electrode layers alternating with the interconnect dielectric layers, wherein the second source/drain conductive line is spaced apart from the first source/drain conductive line in a first direction by a first barrier structure; a first channel layer surrounding outermost sidewalls of the first and second source/drain conductive lines; and a first memory layer surrounding outermost sidewalls of the first channel layer, wherein a first line that continuously extends in the first direction is offset from the first barrier structure in a second direction and intersects the first memory layer, the first source/drain conductive line, and the second source/drain conductive line, and wherein the second direction is perpendicular to the first direction.

In yet other embodiments, the present disclosure relates to a method comprising: forming a stack of dummy gate electrode layers arranged between interconnect dielectric layers over a substrate; forming a first trench within the stack of dummy gate electrode layers; forming a first sacrificial material within the first trench; forming first openings within the first sacrificial material, wherein the first openings are wider than the first trench; replacing the dummy gate electrode layers with gate electrode layers; removing the first sacrificial material; lining the first trench and the first openings with a memory layer, a channel layer, a first dielectric layer, and a second dielectric layer; selectively removing portions of the first and second dielectric layers arranged within the first openings; forming a conductive material within the first openings to form source/drain conductive lines within the first openings; and forming an interconnect structure over an uppermost interconnect dielectric layer to couple interconnect wires to the source/drain conductive lines and the gate electrode layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a stack of dummy gate electrode layers arranged between interconnect dielectric layers over a substrate;
   forming a first trench within the stack of dummy gate electrode layers;
   forming a first sacrificial material within the first trench;
   forming first openings within the first sacrificial material, wherein the first openings are wider than the first trench;
   replacing the dummy gate electrode layers with gate electrode layers;
   removing the first sacrificial material;
   lining the first trench and the first openings with a memory layer, a channel layer, and a first dielectric layer;
   depositing a second dielectric layer in the first trench and the first openings and further overlying the memory layer, the channel layer, and the first dielectric layer, wherein the first openings are only partially filled, and the first trench is fully filled, at completion of the depositing of the second dielectric layer;
   selectively removing portions of the first and second dielectric layers arranged within the first openings;
   forming a conductive material within the first openings to form source/drain conductive lines within the first openings; and
   forming an interconnect structure over an uppermost interconnect dielectric layer to couple interconnect wires to the source/drain conductive lines and the gate electrode layers.

2. The method of claim 1, further comprising:
   forming a second sacrificial material within open areas of the first openings after selectively removing portions of the first and second dielectric layers;
   removing portions of the second sacrificial material and the channel layer in the first openings according to a masking structure to form second openings;
   forming an isolation structure within the second openings; and
   removing the second sacrificial material from the first openings.

3. The method of claim 1, wherein the selectively removing portions of the first and second dielectric layers comprises a non-bias bombardment etching process.

4. The method of claim 1, wherein from a top-view perspective, the first openings have a circular profile.

5. The method of claim 1, wherein from a top-view perspective, the first openings have a rectangular profile.

6. The method of claim 1, wherein the first trench and the first openings have bottom surfaces defined by a bottommost one of the interconnect dielectric layers.

7. The method of claim 1, wherein the first openings have individual bottom surfaces that are vertically offset from a bottommost surface of the first trench in a direction orthogonal to a top surface of the substrate.

8. The method of claim 1, further comprising:
   etching back the memory layer, the channel layer, and the first dielectric layer before the depositing of the second dielectric layer.

9. A method, comprising:
   depositing a multilayer film over a substrate and comprising a plurality of dummy layers alternatingly stacked with a plurality of interconnect dielectric layers;
   performing a first etch into the multilayer film to form a first trench;
   depositing a first sacrificial layer completely filling the first trench;
   performing a second etch into the multilayer film and the first sacrificial layer to form a first opening and a second opening that both overlap with the first trench;
   replacing the plurality of dummy layers with a plurality of conductive gate layers;
   removing the first sacrificial layer to clear the first trench after the replacing;
   depositing a memory layer and a channel layer lining the first trench; and
   forming a source electrode and a drain electrode respectively in the first opening and the second opening.

10. The method according to claim 9, wherein the first and second openings have individual widths that are greater than a width of the first trench and further have individual width-wise centers overlapping with the first trench.

11. The method according to claim 9, further comprising:
    depositing a dielectric layer overlying the memory layer and the channel layer and further lining the first trench, wherein the first trench is completely filled, from the first opening to the second opening, at completion of the depositing of the dielectric layer, and wherein the first and second openings are only partially filled at completion of the depositing of the dielectric layer.

12. The method according to claim 11, further comprising:
    performing a third etch into the dielectric layer to clear the dielectric layer from the first and second openings, wherein the third etch is a maskless blanket etch, and wherein the dielectric layer persists in the trench, from the first opening to the second opening, at completion of the third etch.

13. The method according to claim 9, further comprising:
    depositing a second sacrificial layer filling the first and second openings;
    performing a third etch into the second sacrificial layer to form a third opening and a fourth opening that cut the channel layer and that respectively overlap with the first and second openings; and
    filling the third and fourth openings with dielectric material to respectively form a pair of isolation structures.

14. The method according to claim 13, further comprising:
    replacing portions of the second sacrificial layer between the pair of isolation structures respectively with the source and drain electrodes after the filling.

15. The method according to claim 9, further comprising:
    depositing a first dielectric layer lining the first trench, the first opening, and the second opening and overlying the memory layer and the channel layer; and performing a third etch into the first dielectric layer, the memory layer, and the channel layer to expose individual bottom surfaces of the first and second openings and a bottom surface of the first trench, wherein the third etch is maskless;

wherein the source and drain electrodes are formed after the third etch.

16. A method, comprising:

depositing a multilayer film over a substrate and comprising a plurality of dummy layers alternatingly stacked with a plurality of interconnect dielectric layers;

patterning the multilayer film to form a first trench, which has a source region and a drain region, wherein the first trench has a first width that is substantially uniform from the source region to the drain region and has a second width greater than the first width at the source region and the drain region;

replacing the plurality of dummy layers with a plurality of conductive gate layers after the patterning to form the first trench;

depositing a memory layer, a channel layer, and a first dielectric layer lining and partially filling the first trench;

forming a pair of isolation structures cutting the channel layer respectively in the source and drain regions of the first trench; and forming a source electrode and a drain electrode respectively in the source and drain regions of the first trench, wherein the source and drain electrodes are formed between the pair of isolation structures.

17. The method according to claim 16, wherein the source and drain regions have individual top geometries that are circle shaped.

18. The method according to claim 16, wherein the second width is a minimum width of the source and drain regions, and wherein the first width is a maximum width of the first trench between the source and drain regions.

19. The method according to claim 16, further comprising:

depositing a second dielectric layer in the first trench and overlying the memory layer, the channel layer, and the first dielectric layer, wherein the second dielectric layer only partially fills the source and drain regions of the first trench at completion of the depositing of the second dielectric layer, and fully fills the first trench from the source region to the drain region at completion of the depositing of the second dielectric layer.

20. The method according to claim 16, further comprising:

clearing the first and second dielectric layers from the source and drain regions of the first trench, wherein the first and second dielectric layers persist in the first trench, between the source and drain regions, at completion of the clearing.

* * * * *